United States Patent
Lu et al.

(10) Patent No.: US 11,296,080 B2
(45) Date of Patent: Apr. 5, 2022

(54) SOURCE/DRAIN REGIONS OF SEMICONDUCTOR DEVICES AND METHODS OF FORMING THE SAME

(71) Applicant: Taiwan Semiconductor Manufacturing Co., Ltd., Hsinchu (TW)

(72) Inventors: Wei Hao Lu, Taoyuan (TW); Yi-Fang Pai, Hsinchu (TW); Cheng-Wen Cheng, Hsinchu (TW); Li-Li Su, ChuBei (TW); Chien-I Kuo, Chiayi County (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 3 days.

(21) Appl. No.: 16/901,791

(22) Filed: Jun. 15, 2020

(65) Prior Publication Data

US 2021/0391324 A1 Dec. 16, 2021

(51) Int. Cl.
*H01L 27/088* (2006.01)
*H01L 21/8234* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
CPC . H01L 29/41783; H01L 29/0843–0891; H01L 21/823821; H01L 21/845; H01L 29/66795–66818; H01L 29/41791; H01L 29/785–786; H01L 2029/7857–7858; H01L 27/0886; H01L 27/0924;
(Continued)

(56) References Cited

U.S. PATENT DOCUMENTS

| | | |
|---|---|---|
| 5,489,860 A | 2/1996 | Kitagawa et al. |
| 6,950,354 B1 | 9/2005 | Akiyoshi |

(Continued)

FOREIGN PATENT DOCUMENTS

| | | |
|---|---|---|
| TW | 200744099 A | 12/2007 |
| TW | 201312574 A | 3/2013 |

(Continued)

*Primary Examiner* — Sonya McCall-Shepard
(74) *Attorney, Agent, or Firm* — Slater Matsil, LLP

(57) ABSTRACT

A semiconductor device includes: a first fin and a second fin extending from a substrate and an epitaxial source/drain region. The epitaxial source/drain region includes a first portion grown on the first fin and a second portion grown on the second fin, and the first portion and the second portion are joined at a merging boundary. The epitaxial source/drain region further includes a first subregion extending from a location level with a highest point of the epitaxial source/drain region to a location level with a highest point of the merging boundary, a second subregion extending from the location level with the highest point of the merging boundary to a location level with a lowest point of the merging boundary, and a third subregion extending from the location level with the lowest point of the merging boundary to a location level with a top surface of an STI region.

20 Claims, 26 Drawing Sheets

(51) Int. Cl.
  *H01L 29/167* (2006.01)
  *H01L 29/08* (2006.01)

(52) U.S. Cl.
  CPC .. *H01L 21/823481* (2013.01); *H01L 29/0847* (2013.01); *H01L 29/167* (2013.01)

(58) Field of Classification Search
  CPC ......... H01L 27/10826; H01L 27/10879; H01L 27/1211; H01L 29/7848; H01L 21/823814; H01L 21/823418–823425; H01L 21/823431; H01L 29/66636–66643
  See application file for complete search history.

(56) References Cited

U.S. PATENT DOCUMENTS

| | | | |
|---|---|---|---|
| 7,236,396 | B2 | 6/2007 | Houston et al. |
| 8,035,170 | B2 | 10/2011 | Inaba |
| 8,421,205 | B2 | 4/2013 | Yang |
| 8,455,028 | B2 | 6/2013 | Breunig et al. |
| 8,487,378 | B2 | 7/2013 | Goto et al. |
| 8,605,523 | B2 | 12/2013 | Tao et al. |
| 8,630,132 | B2 | 1/2014 | Cheng et al. |
| 8,661,389 | B2 | 2/2014 | Chern et al. |
| 8,693,235 | B2 | 4/2014 | Liaw |
| 8,698,205 | B2 | 4/2014 | Tzeng et al. |
| 8,729,634 | B2 | 5/2014 | Shen et al. |
| 8,760,948 | B2 | 6/2014 | Tao et al. |
| 8,826,212 | B2 | 9/2014 | Yeh et al. |
| 8,826,213 | B1 | 9/2014 | Ho et al. |
| 8,836,141 | B2 | 9/2014 | Chi et al. |
| 8,887,106 | B2 | 11/2014 | Ho et al. |
| 8,962,400 | B2 | 2/2015 | Tsai et al. |
| 9,093,514 | B2 | 7/2015 | Tsai et al. |
| 9,129,707 | B2 | 9/2015 | Lin et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,644 | B2 | 2/2017 | Liaw |
| 9,576,814 | B2 | 2/2017 | Wu et al. |
| 9,608,116 | B2 | 3/2017 | Ching et al. |
| 9,721,645 | B1 | 8/2017 | Liaw |
| 9,812,363 | B1 | 11/2017 | Liao et al. |
| 9,859,380 | B2 | 1/2018 | Lee et al. |
| 9,935,001 | B2 | 4/2018 | Liaw |
| 9,953,875 | B1 * | 4/2018 | Cheng ............... H01L 29/66545 |
| 2002/0001251 | A1 | 1/2002 | Fujino et al. |
| 2005/0219914 | A1 | 10/2005 | Sarin et al. |
| 2006/0171194 | A1 | 8/2006 | Lowrey et al. |
| 2007/0283084 | A1 | 12/2007 | Chiu et al. |
| 2008/0091969 | A1 | 4/2008 | Kurumada et al. |
| 2008/0253171 | A1 | 10/2008 | Terada et al. |
| 2012/0294100 | A1 | 11/2012 | Ling et al. |
| 2013/0181297 | A1 | 7/2013 | Liaw |
| 2013/0235640 | A1 | 9/2013 | Liaw |
| 2014/0032871 | A1 | 1/2014 | Hsu et al. |
| 2014/0054716 | A1 | 2/2014 | Chen et al. |
| 2014/0119131 | A1 | 5/2014 | Verma et al. |
| 2014/0153321 | A1 | 6/2014 | Liaw |
| 2014/0153345 | A1 | 6/2014 | Kim et al. |
| 2014/0177352 | A1 | 6/2014 | Lum |
| 2014/0215420 | A1 | 7/2014 | Lin et al. |
| 2014/0233330 | A1 | 8/2014 | Ko et al. |
| 2014/0241077 | A1 | 8/2014 | Katoch et al. |
| 2014/0264924 | A1 | 9/2014 | Yu et al. |
| 2014/0269114 | A1 | 9/2014 | Yang et al. |
| 2014/0282289 | A1 | 9/2014 | Hsu et al. |
| 2014/0282326 | A1 | 9/2014 | Chen et al. |
| 2014/0325466 | A1 | 10/2014 | Ke et al. |

FOREIGN PATENT DOCUMENTS

| | | |
|---|---|---|
| TW | 201432677 A | 8/2014 |
| WO | 2009059906 A1 | 5/2009 |

* cited by examiner

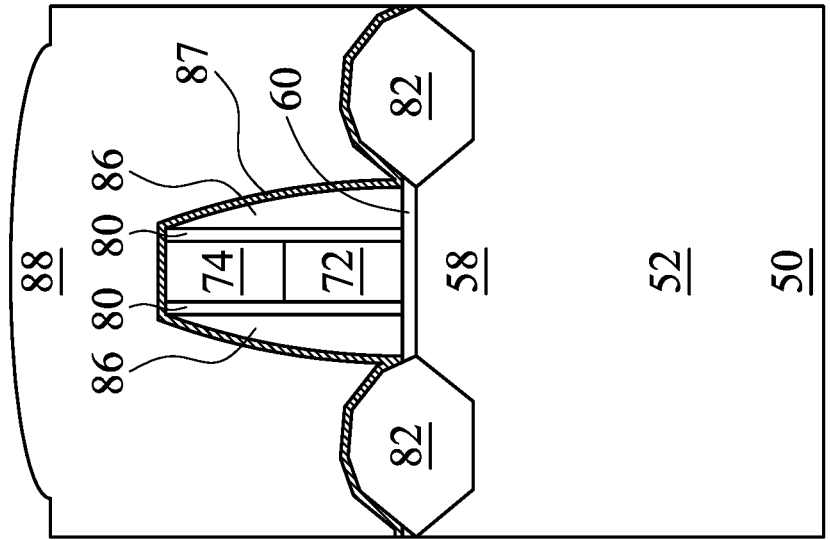
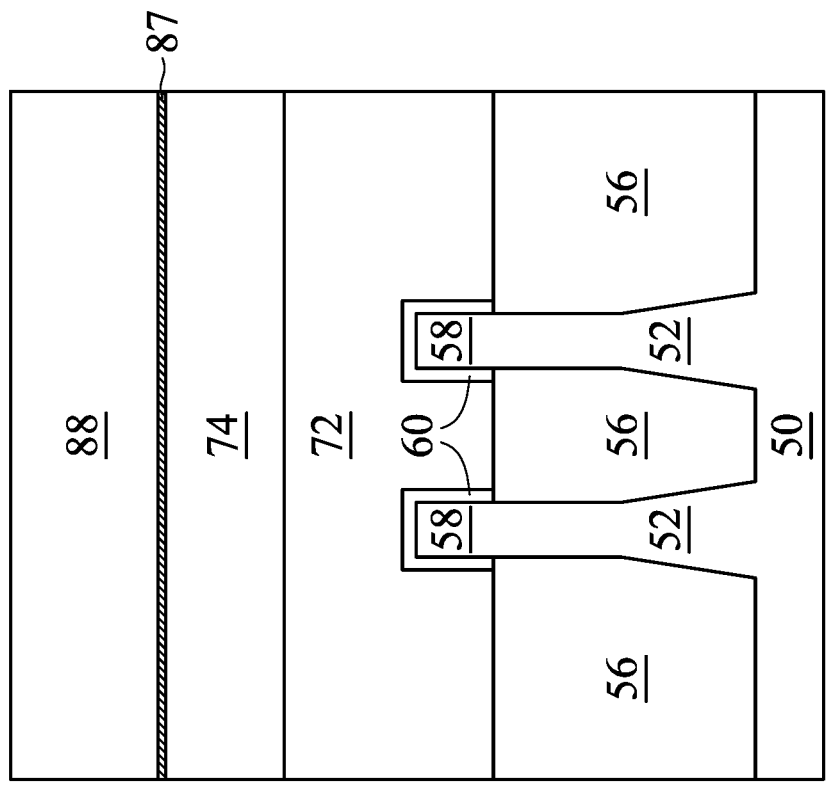

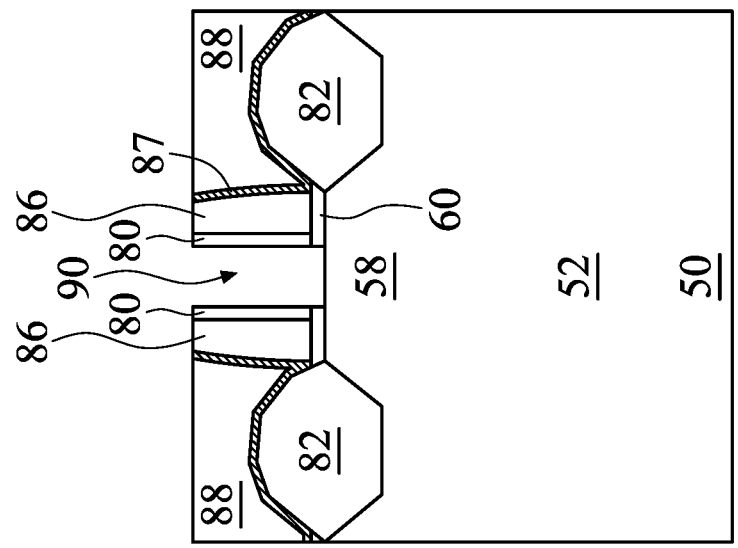
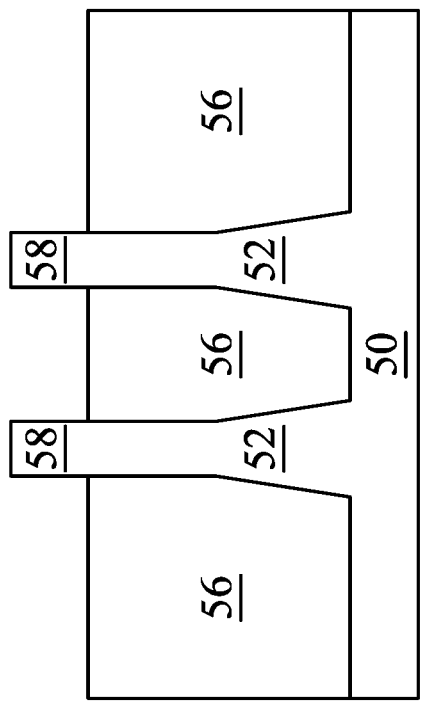
Figure 13B
Figure 13A

SOURCE/DRAIN REGIONS OF SEMICONDUCTOR DEVICES AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

As the semiconductor industry has progressed into nanometer technology process nodes in pursuit of higher device density, higher performance, low power consumption, and lower costs, challenges from both fabrication and design issues have resulted in the development of three-dimensional designs, such as a Fin Field Effect Transistor (FinFET). FinFET devices typically include semiconductor fins in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decrease in scaling, new challenges are presented to IC fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 10E, 11A, 11B, 11C, 11D, 12A, 12B, 12C, 12D, 13A, 13B, 13C, 13D, 14A, 14B, 14C, 14D, 14E, 15A, 15B, 15C, 15D, 16A, 16B, 16C, 16D, and 16E are cross-sectional views of intermediate stages in the manufacturing of FinFETs, in accordance with some embodiments.

DETAILED DESCRIPTION

Figure 1:
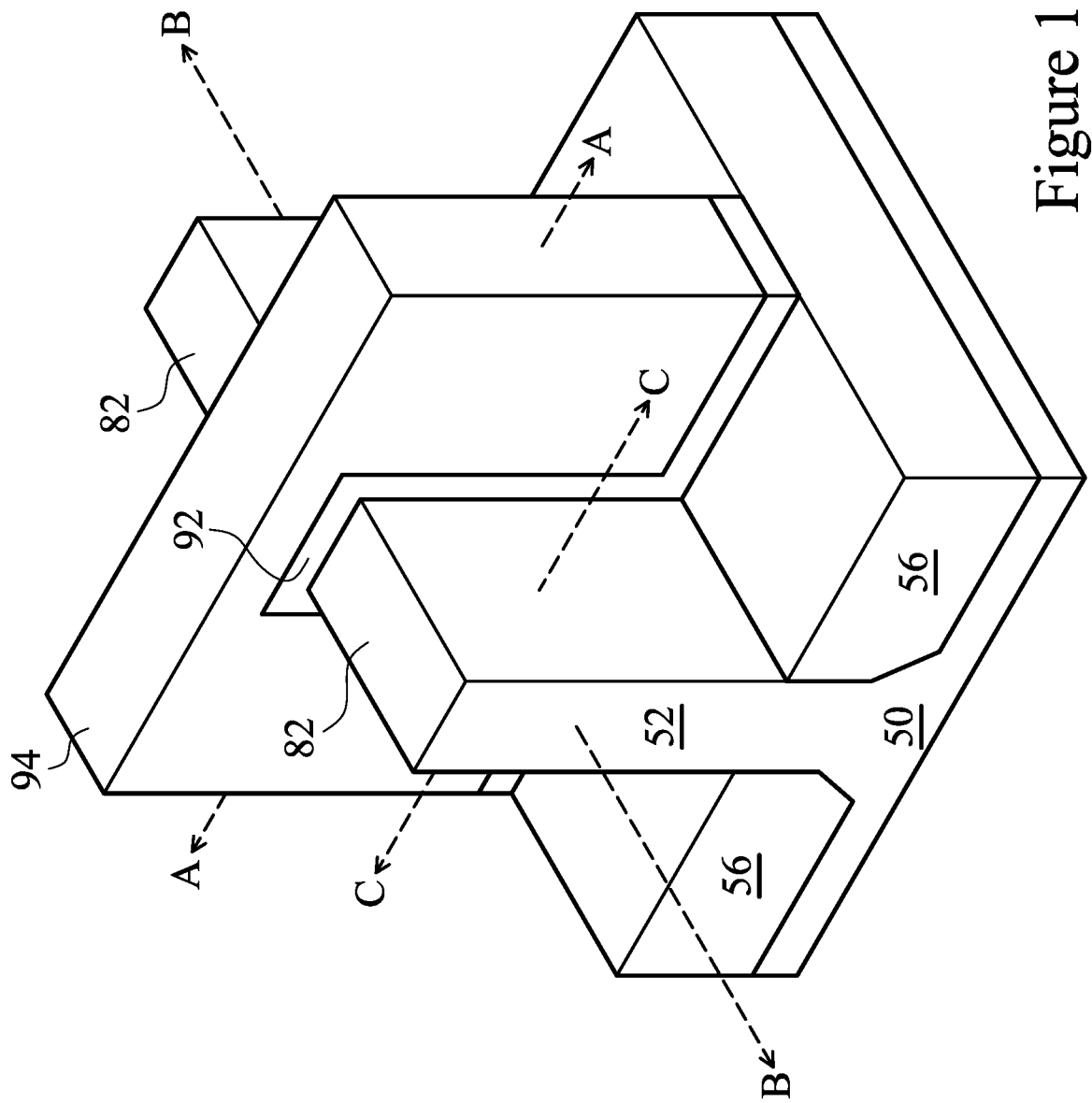
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the present disclosure relate to an epitaxial scheme for a source/drain region in a semiconductor device, such as an n-type Field Effect Transistor (nFET), which may be a Fin Field Effect Transistor (FinFET) device. Source/drain regions of transistors, for example, and methods for forming such features are described. Techniques and apparatus are provided herein for forming source/drain regions in a semiconductor device having a rounded top profile. The techniques may reduce nodule defects by choice of carrier gas and an optimized gas ratio. In embodiments in which the FinFETs are used in memory arrays including high current (HC) static random access memory (SRAM) areas, the rounded top shapes of the epitaxial source/drain regions may prevent non-merging of intra-fin epitaxial regions, e.g. silicon phosphide (SiP), of neighboring source/drain regions. In embodiments in which the FinFETs are used in memory arrays including high density (HD) SRAM areas, the rounded top shapes of the epitaxial source/drain regions may improve fin coverage of HD SRAM structures and prevent merging, or shorts, between neighboring HD SRAM source/drain regions by creating slimmer epitaxial source/drain shapes. The rounded top profiles of the epitaxial regions can permit a larger landing area for a contact for both HC and HD SRAM structures, which may further reduce contact resistance. The rounded top profiles may reduce highly doped SiP source/drain region loss for downstream middle end of line (MEOL) and back end of line (BEOL) processes. Total production throughput may improve by about 20% due to a higher epitaxial growth rate and a reduced transition time. The higher intra-fin merge height of the HC SRAM structures and the slim epitaxial source/drain region shapes of the HD SRAM structures may improve device performance by reducing the capacitance effect of the source/drain regions. Enlarged highly doped source/drain volume may lead to reduced source/drain contact plug resistance.

Example techniques for forming the source/drain regions are described and illustrated herein with respect to Fin Field-Effect Transistors (FinFETs); however, an epitaxy scheme within the scope of this disclosure can also be implemented in other semiconductor devices. Further, intermediate stages of forming FinFETs are illustrated. Some aspects described herein are described in the context of FinFETs formed using a replacement gate process. In other examples, a gate-first process is used, as a person of ordinary skill in the art will readily understand. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps described herein.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 16E are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, and 16A are illustrated along reference cross-section A-A illustrated in FIG. 1, and FIGS. 8B, 9B, 10B, 10E, 11B, 12B, 13B, 14B, 14E, 15B, 16B, and 16E are illustrated along a similar cross-section B-B illustrated in FIG. 1, except for multiple fins/FinFETs. FIGS. 10C, 10D, 11C, 11D, 12C, 12D, 13C, 13D, 14C, 14D, 15C, 15D, 16C, and 16D are illustrated along reference cross-section C-C illustrated in FIG. 1, except for multiple fins/FinFETs.

Figure 2:
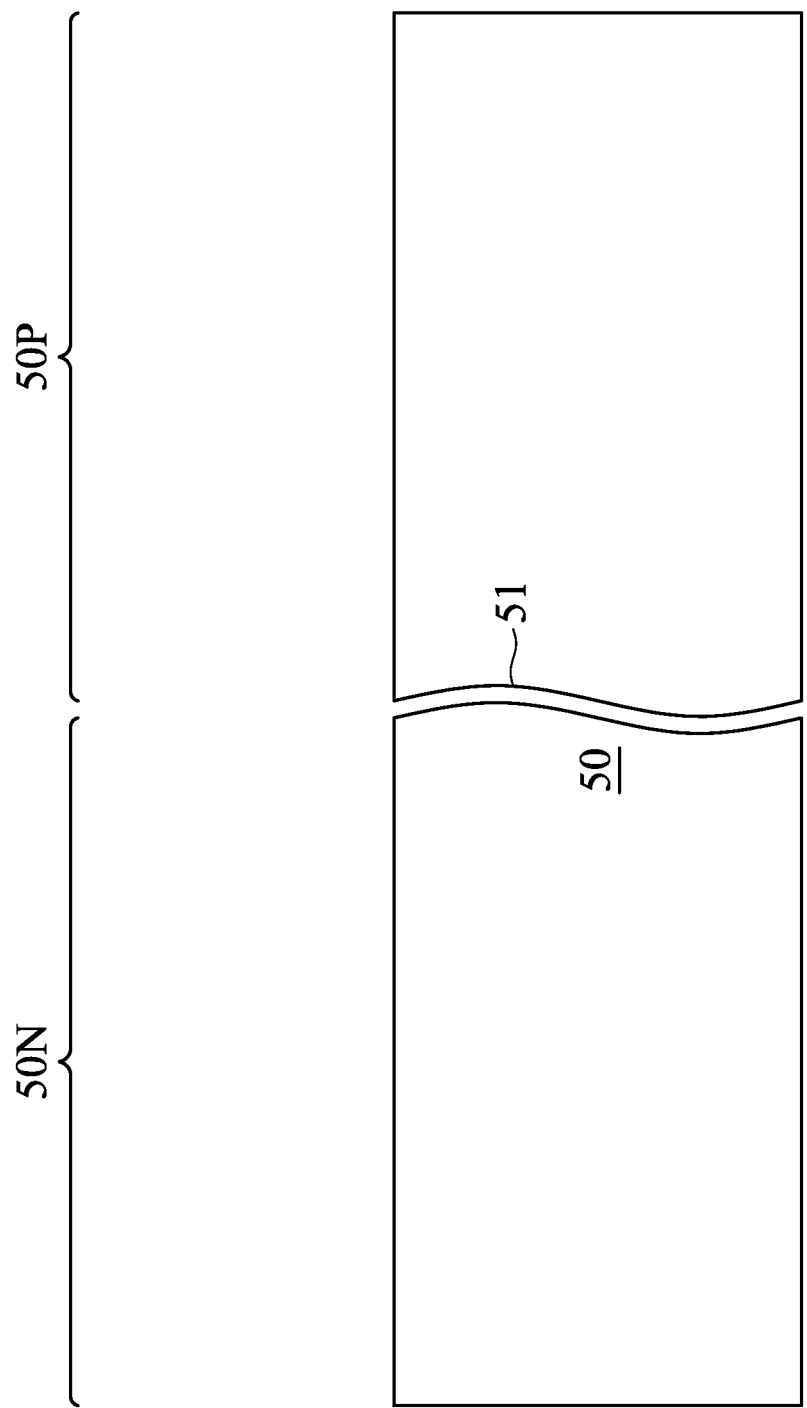

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
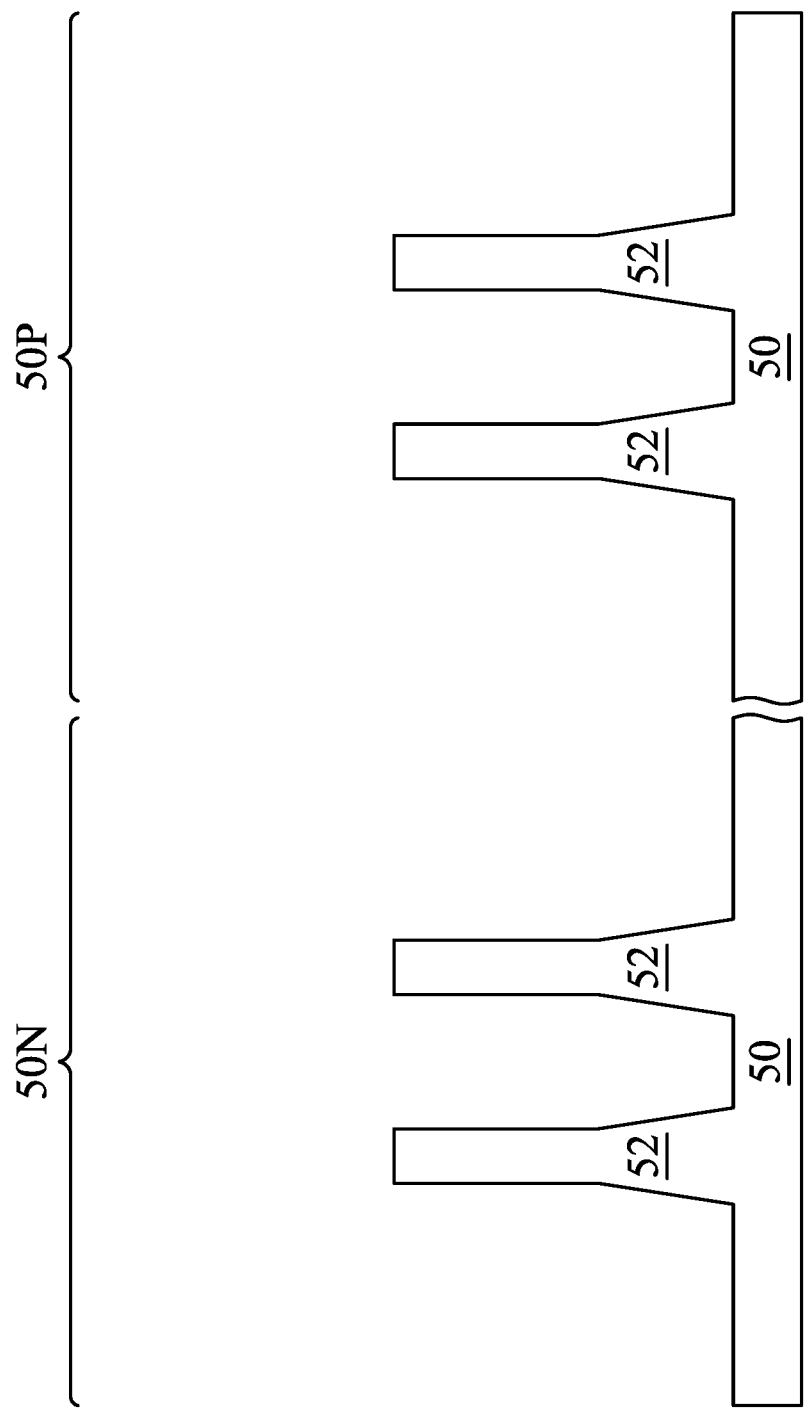

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
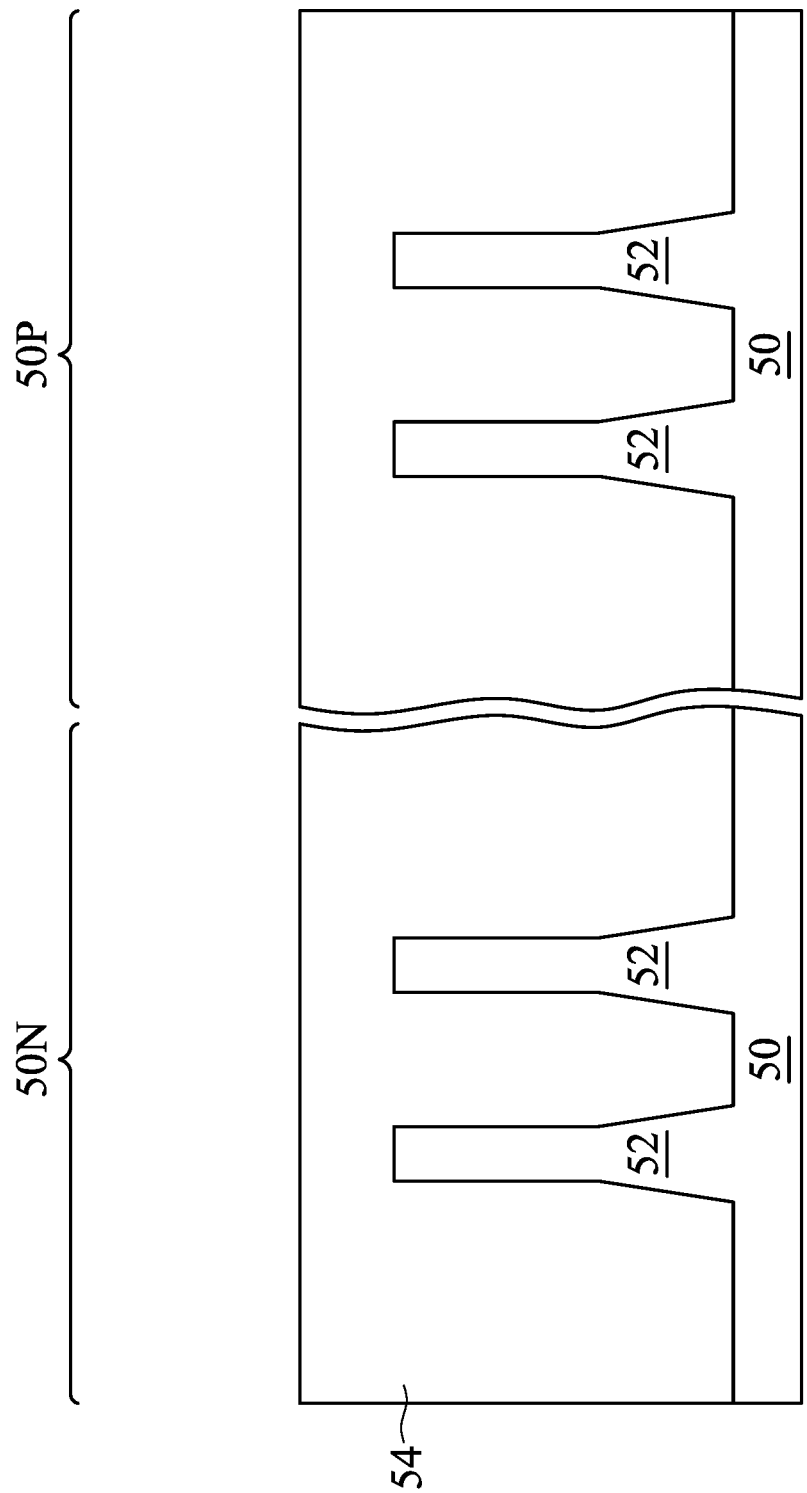

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
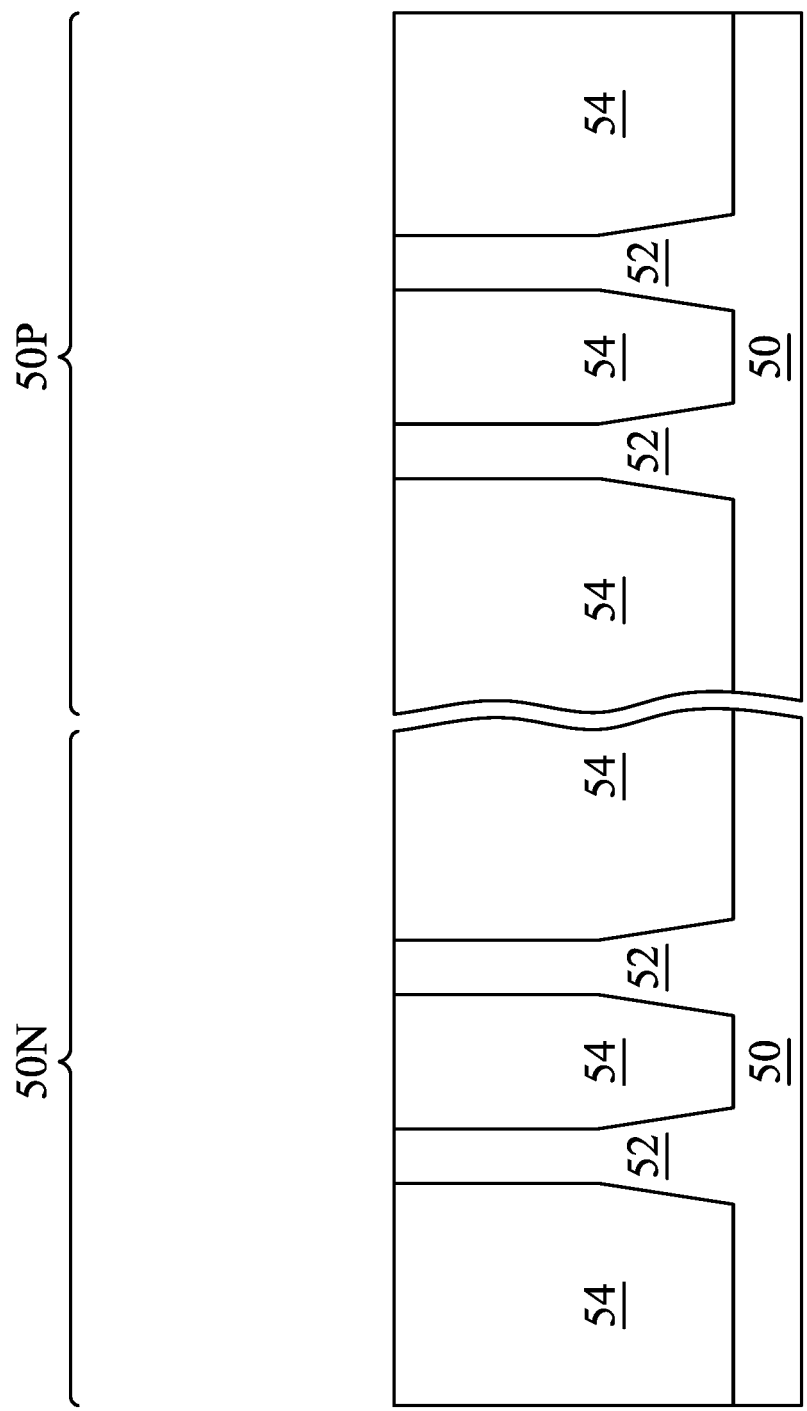

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
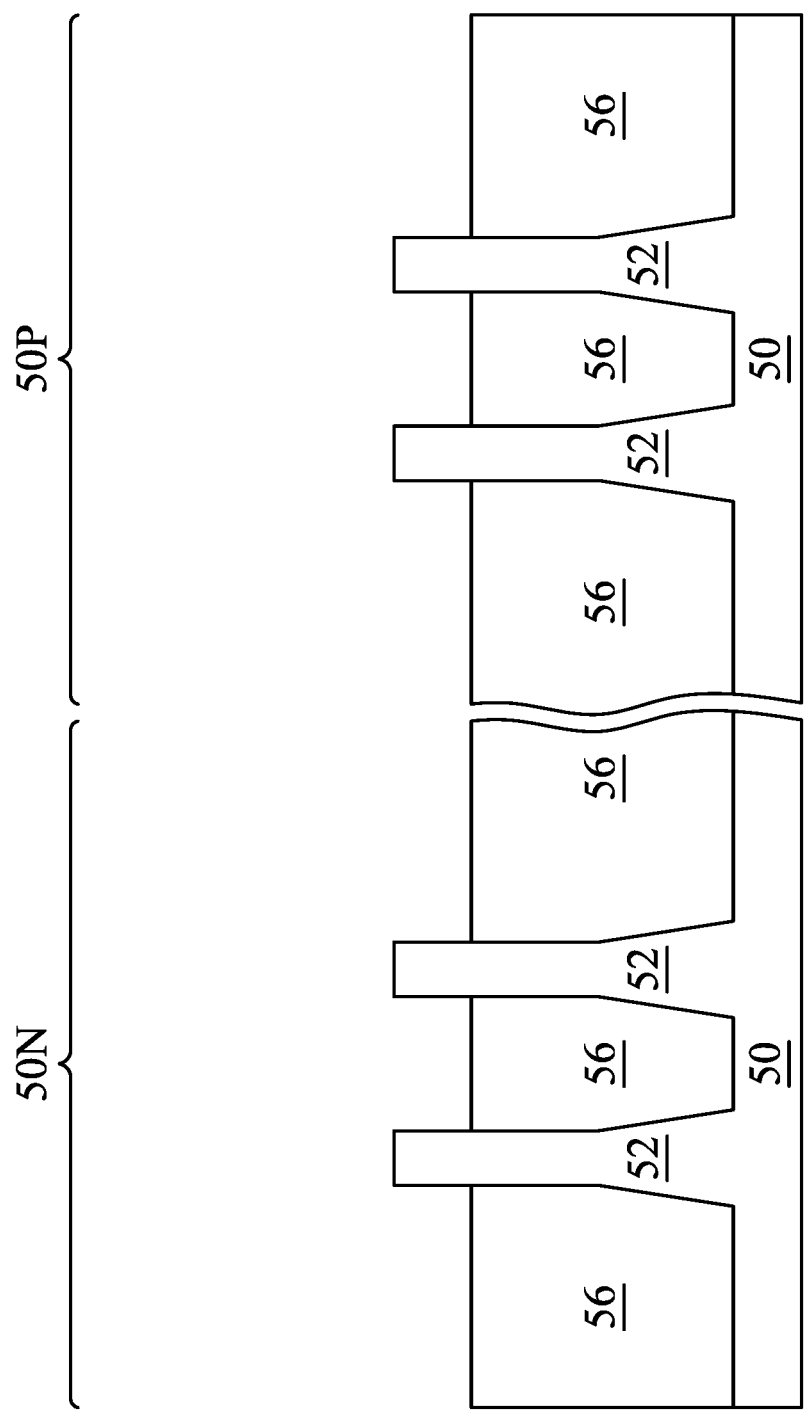

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric acid (dHF) may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}\, cm^{-3}$ and about $10^{18}\, cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}\, cm^{-3}$, such as between about $10^{16}\, cm^{-3}$ and about $10^{18}\, cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
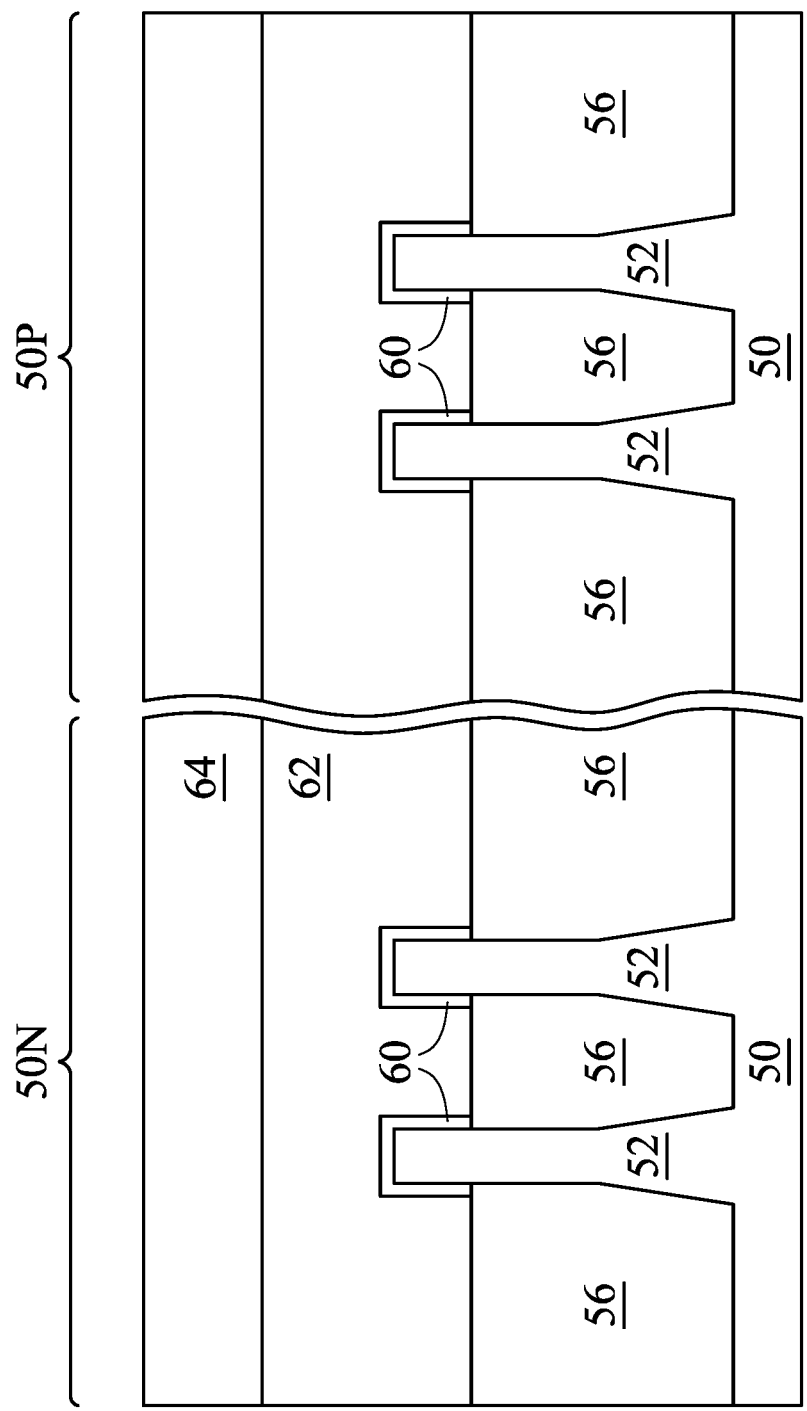

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8B:
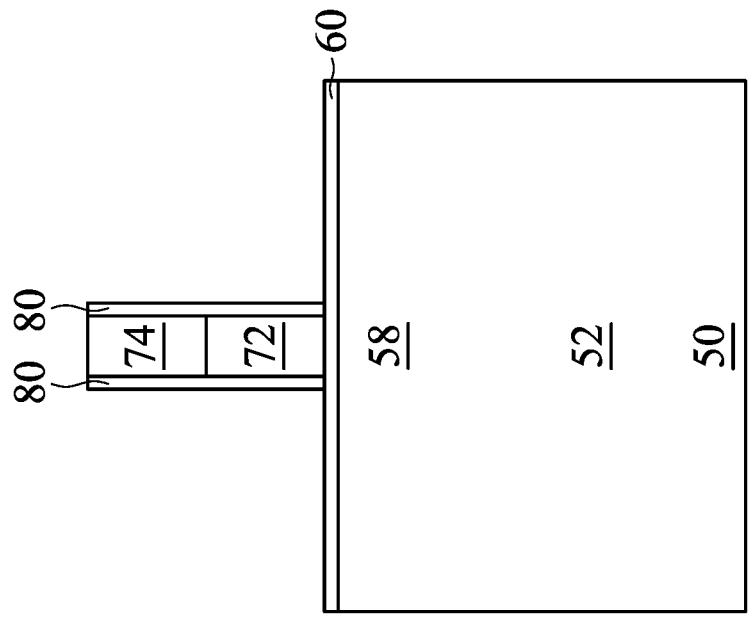
Figure 8A:
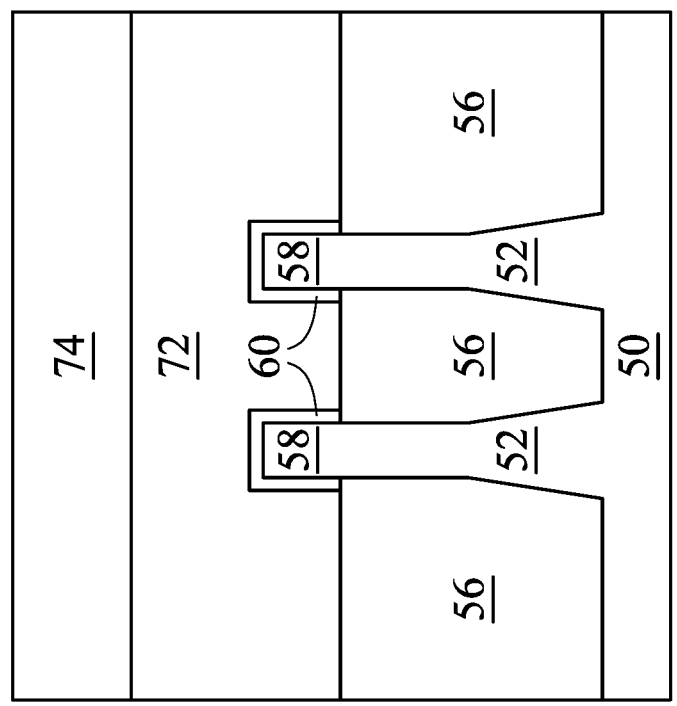

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
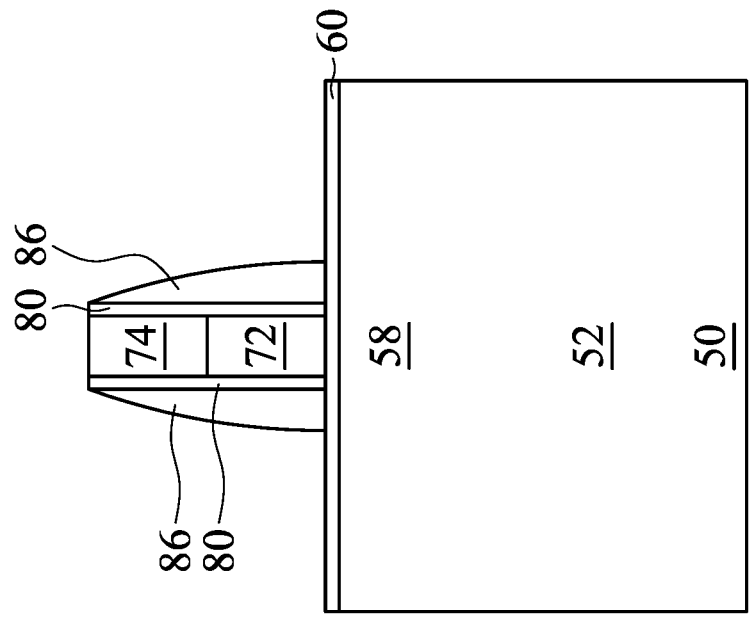
Figure 9A:
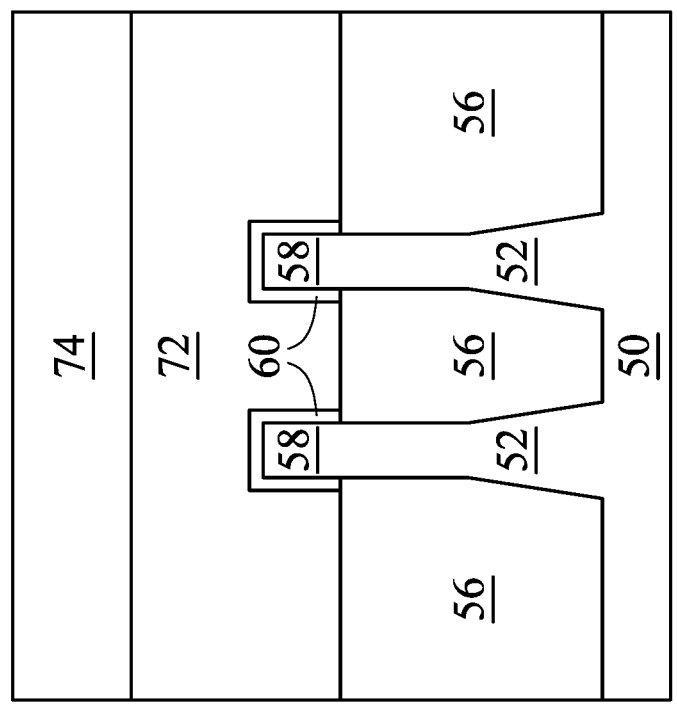

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like. In some embodiments, the gate spacers 86 may have dangling bonds on outer surfaces.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
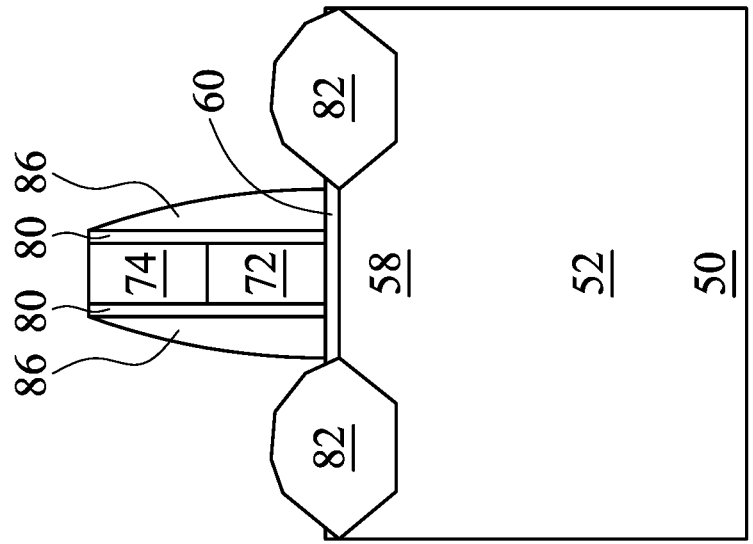
Figure 10A:
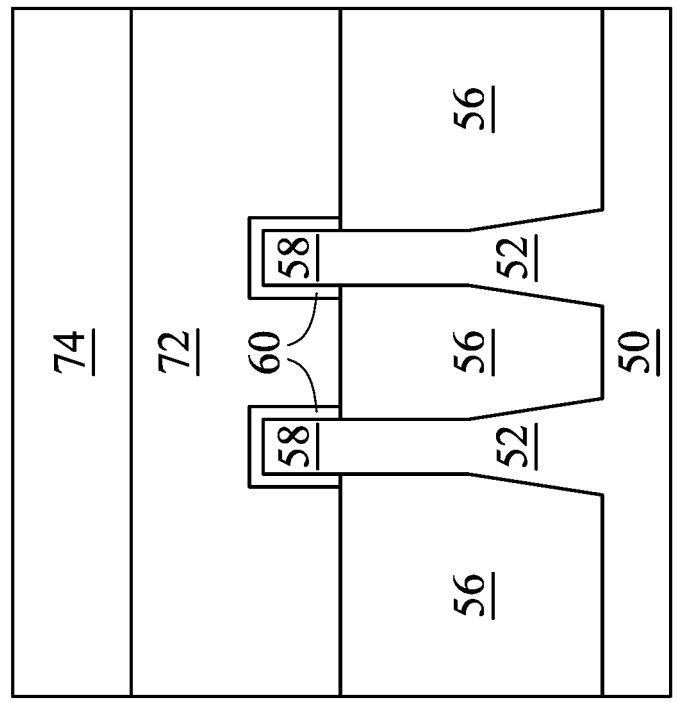

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. The epitaxial source/drain regions 82 in the region 50N may have surfaces raised from respective surfaces of the fins 52 and may have facets.

The epitaxial source/drain regions 82 can be formed using an epitaxy process such as a cyclic deposition-etch (CDE) process. The CDE process includes a number of repeated cycles, such as in a range from 2 cycles to 10 cycles. Each cycle of the CDE process includes a deposition process followed by an etch process. In some embodiments, the deposition process of the CDE process includes a chemical vapor deposition (CVD) process, such as reduced pressure chemical vapor deposition (RPCVD), low pressure CVD (LPCVD), the like, or a combination thereof. In some embodiments, the process is RPCVD.

For example, if the fin 52 is silicon, the epitaxial source/drain regions 82 in the region 50N may include materials exerting a tensile strain in the channel region 58, such as silicon phosphide (SiP), silicon phosphorous carbide (SiPC), or the like. The epitaxial source/drain regions 82 are in situ doped with the conductivity dopant species (e.g., an n-type dopant, like phosphorous in embodiments described herein). A silicon source precursor gas can be used for the RPCVD. The silicon source precursor gas can be a silicon-rich precursor gas, such as including silane (SiH$_4$), dichlorosilane (SiH$_2$Cl$_2$, DCS), trichlorosilane (SiHCl$_3$), disilane (Si$_2$H$_6$), a combination thereof, or the like. A flow rate of the silicon source precursor gas of the RPCVD can be in a range from about 40 sccm to about 1000 sccm.

The RPCVD process can also include a phosphorous source precursor gas. The phosphorous source precursor gas can include phosphine (PH$_3$), phosphorus oxychloride, another phosphorous-containing precursor, and/or any combination thereof. In some embodiments, a ratio of the silicon source precursor to the phosphorous source precursor gas is in a range from about 50 to about 300. Carrier gases, such as hydrogen (H$_2$), can be mixed with the precursors in either of the above embodiments. In some embodiments, the RPCVD process uses a silicon-rich precursor gas, such as dichlorosilane (DCS), and a phosphorous source precursor gas, such as phosphine, with a hydrogen carrier gas. In some embodiments, a ratio of the silicon source precursor to the carrier gas is in a range from about 2:1 to about 10:1.

In some embodiments, the use of dichlorosilane (DCS) as the silicon source precursor and hydrogen as the carrier gas during the epitaxial growth of epitaxial source/drain regions 82 may produce rounded top profiles of the epitaxial source/drain regions 82. DCS may allow for even growth of crystalline silicon in most or all lattice planes and hydrogen may inhibit the growth of crystalline silicon in the 100 plane (horizontal growth) because the hydrogen attaches to dangling bonds in the 100 plane while not inhibiting growth in the 110 and 111 lattice planes. Using the combination of DCS as the silicon source precursor and hydrogen as the carrier gas may allow for controlled growth of rounded top profiles. An amount of hydrogen in a range of about 2 L to about 10 L may be used in order to produce the rounded top profiles.

In some embodiments, the use of hydrogen as a carrier gas may prevent or reduce the formation of nodule defects, such as on the gate spacers 86 which may comprise a nitride such as, e.g. SiN. Nodule defects may be roughly spherical growths that form during the epitaxial growth process due to the precursor gases attaching disproportionately to dangling bonds on, such as e.g. the gate spacers 86. Nodule defects can lower device performance by altering the shape of the epitaxial source/drain regions 82. The hydrogen carrier gas may passivate the surface of the gate spacers 86 by terminating on the surface of the gate spacers 86, which may prevent nodule defects from forming during the growth of the epitaxial source/drain regions 82.

A pressure of the RPCVD can be equal to or less than about 300 Torr, such as in a range from about 50 Torr to about 300 Torr. In some cases, a pressure of smaller than 50 Torr for the RPCVD may provide an insufficient dopant concentration. In some cases, a pressure of greater than 300 Torr for the RPCVD may lead to selective loss. The pressure can vary depending on the particular process being used. A temperature of the RPCVD can be in a range from about 650° C. to about 750° C. In some embodiments, the parameters may vary based on the process.

The epitaxial source/drain regions 82 can have various concentrations of the conductivity dopant species. When phosphorous is implemented as the conductivity dopant species, e.g., from epitaxial growth with phosphorous, a concentration of phosphorous in the epitaxial source/drain regions 82 can be in a range from about $1 \times 10^{21}$ atoms/cm$^{-3}$ to about $4 \times 10^{21}$ atoms/cm$^{-3}$.

In some embodiments, the deposition process forms an epitaxial layer, such as SiP, in the recesses formed in the fins 52 and an amorphous material on non-crystalline surfaces. In some embodiments, after the deposition process, a post-deposition purge operation is used to remove the deposition gases from the process chamber. An inert gas, such as He, Ar, or Ne, may be used in this operation to purge the deposition gases from the process chamber. Once the deposition gases are removed from the chamber, the etch process follows.

The etching (or partial etching) process of the CDE process removes the amorphous material and may also remove a portion of the deposited epitaxial layer. The remaining epitaxial layer forms the epitaxial source/drain regions 82. The etch process can be an in situ etch process performed in the chamber of the deposition process. In some embodiments, an etch gas is flowed into the chamber to etch the amorphous material. Etch gases such as chlorine ($Cl_2$), hydrochloric acid (HCl), hydrofluoric acid (HF), hydrobromic acid (HBr), or the like can be used. A pressure during the etch process can be equal to or less than about 300 Torr, such as in a range from about 5 Torr to about 300 Torr. A temperature during the etch process can be in range from about 625° C. to about 750° C. In some examples, after the etching process, a purge operation follows to remove the etching gases from the chamber.

The etching process can remove the amorphous material at a greater rate than the epitaxial material. This may be done with an etch selective to the amorphous material such as, e.g. an HCl etch, performed at a temperature in a range of about 625° C. to about 750° C. and at a pressure in a range of about 5 Torr to about 300 Torr. Therefore, the epitaxial material remains on, e.g., the surfaces of the epitaxial source/drain regions 82 after the deposition-etch cycle. The deposition-etch cycle may be repeated a number of times until a desired thickness of the epitaxial source/drain regions 82 is reached. By removing appropriate portions of amorphous material, desired shapes of the epitaxial source/drain regions 82 may be produced. As a result, such repeated deposition-etch process is called a cyclic deposition-etch (CDE) process.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

Figure 10D:
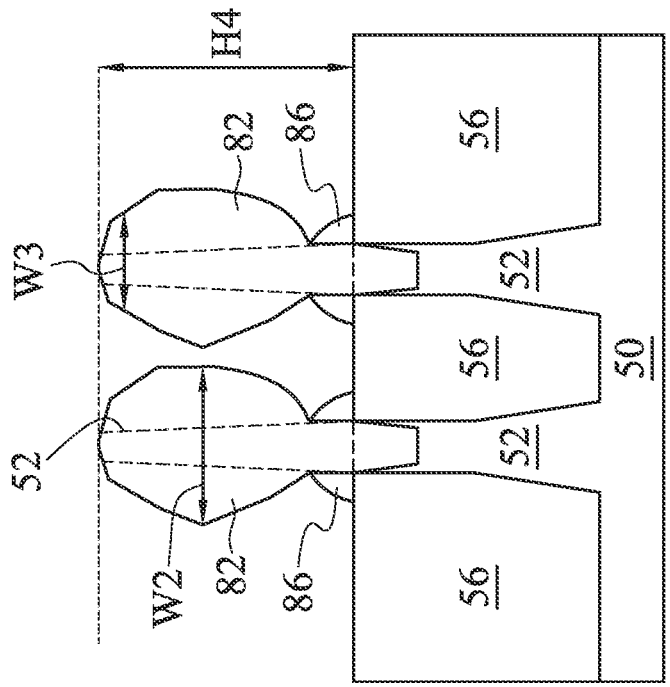
Figure 10C:
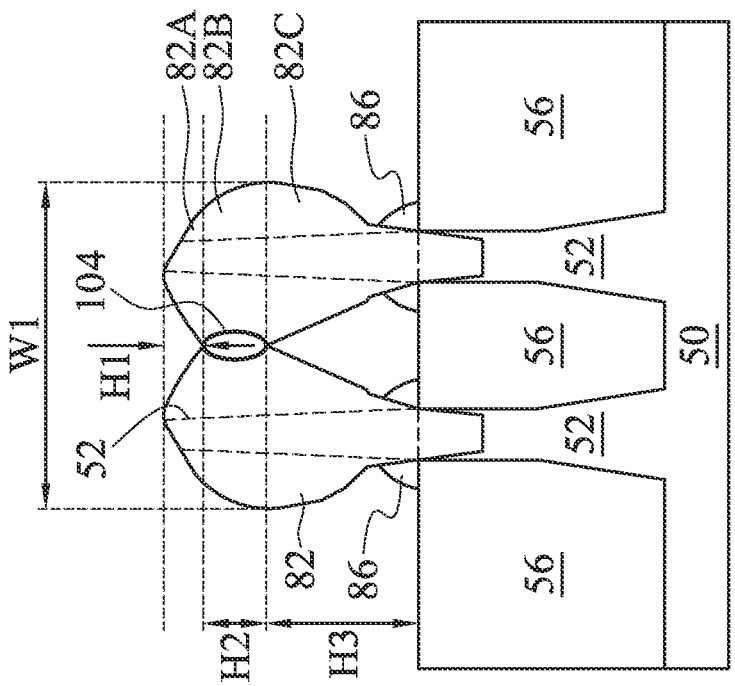

As a result of the epitaxy processes used to form the epitaxial source/drain regions 82 in the region 50N and the region 50P, upper surfaces of the epitaxial source/drain regions 82 have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

In FIG. 10C, the upper facets of adjacent source/drain regions 82 have merged, producing a merged epitaxial source/drain region 82 with a first portion disposed in a first fin 52, and a second portion disposed in a second fin 52. Top surfaces of the first and second fins 52 are shown in outline in FIG. 10C. The first portion and the second portion of the merged epitaxial source/drain region 82 are joined at a merging boundary 104. The merging boundary 104 may extend from a lowest point of a valley between the fins 52 in the top surface of the merged epitaxial source/drain region 82 to a vertex of the bottom surface of the merged epitaxial source/drain region 82 located between the fins 55.

The merged epitaxial source/drain region 82 may have a first width W1 in a range of about 40 nm to about 70 nm. It is advantageous for the first width W1 to be in the range of about 40 nm to about 70 nm for improving both process yields and device properties. The first width W1 being less than about 40 nm may lead to lower yield and device loss. The first width W1 being greater than about 70 nm may lead to lower yield and device loss.

The merged epitaxial source/drain region 82 comprises a first subregion 82A extending from a highest point of the merged epitaxial source/drain region 82 to a highest point of the merging boundary 104. The top surface of the first subregion 82A comprises two rounded top profiles. In some embodiments, the use of dichlorosilane (DCS) as the silicon source precursor and hydrogen as the carrier gas during the epitaxial growth of the epitaxial source/drain regions 82 may produce rounded top profiles of the merged epitaxial source/drain regions 82. DCS may allow for even growth of crystalline silicon in most or all lattice planes and hydrogen may inhibit the growth of crystalline silicon in the 100 plane (horizontal growth) because the hydrogen attaches to dangling bonds in the 100 plane while not inhibiting growth in the no and in lattice planes. Using the combination of DCS as the silicon source precursor and hydrogen as the carrier gas may allow for controlled growth of rounded top profiles. An amount of hydrogen in a range of about 2 L to about 10 L may be used in order to produce the rounded top profiles.

The rounded top profiles are located above opposite sides of the merging boundary 104. The first subregion 82A may have a first height H1 in a range of less than about 10 nm. In some embodiments, the top surface of the first subregion 82A has a valley between the fins 52. Because the merging boundary 104 is located above the widest diameter of the merged epitaxial source/drain region 82, the valley between the rounded top profiles of the merged epitaxial source/drain region 82 may be relatively shallow, in comparison with a valley formed with a merging boundary located in a lower position. The valley between the rounded top profiles of the merged epitaxial source/drain region 82 may provide a more stable landing area for source/drain contacts. Because the valley between the rounded top profiles of the merged epitaxial source/drain region 82 is relatively shallow, formation of source/drain contacts such as, e.g., metal plugs is less likely to break through the merged facets of the epitaxial source/drain region 82 between the fins 52.

The valley may have a height equal to the first height H1 from its lowest point to its highest point. It is advantageous for the first height H1 to be in the range of about less than 10 nm for improving both process yields and device properties. The first height H1 being greater than about 10 nm may lead to lower yield and device loss.

The merged epitaxial source/drain region 82 further comprises a second subregion 82B extending from the highest point of the merging boundary 104 to a lowest point of the merging boundary 104. The second subregion 82B may have a second height H2 in a range of about 18 nm to about 28 nm. It is advantageous for the second height H2 to be in the range of about 18 nm to about 28 nm for improving both process yields and device properties. The second height H2 being less than about 18 nm may lead to lower yield and device loss. The second height H2 being greater than about 28 nm may lead to lower yield and device loss. A ratio of the first height H1 to the second height H2 may be in a range of about 0:28 to about 10:18. It is advantageous for the ratio H1:H2 to be in the range of about 0:28 to about 10:18 for improving both process yields and device properties. The ratio H1:H2 being greater than about 5:9 may lead to lower yield and device loss.

The merged epitaxial source/drain region 82 further comprises a third subregion 82C extending from the lowest point of the merging boundary 104 to the top surface of the STI regions 56. The third subregion 82C may have a third height H3 in a range of about 25 nm to about 40 nm. It is advantageous for the third height H3 to be in the range of about 25 nm to about 40 nm for improving both process yields and device properties. The third height H3 being less than about 25 nm may lead to device loss. A ratio of the first height H1 to the third height H3 may be in a range of about 0:25 to about 10:40. It is advantageous for the ratio H1:H3 to be in the range of about 0:28 to about 10:40 for improving both process yields and device properties.

Embodiments of the merged epitaxial source/drain regions 82 may provide advantages. The merged epitaxial source/drain regions 82 may be useful for high current (HC) SRAM transistors. HC SRAM transistors comprising multiple fin FinFETs with merged epitaxial source/drain regions may be useful for high speed circuits to achieve good performance in speed. The rounded top profiles of the epitaxial source/drain regions 82 may prevent failures to merge by increasing the horizontal widths of the neighboring epitaxial source/drain regions 82 near their top surfaces. The rounded top profiles of the merged epitaxial source/drain region 82 may form a better landing for source/drain contact plugs, as described below with respect to FIG. 16C. The higher intra-fin merge height of the merged epitaxial source/drain regions 82 may improve device performance by reducing the capacitance effect of the source/drain regions.

In FIG. 10D, the upper facets of adjacent source/drain regions 82 have not merged, producing adjacent non-merged epitaxial source/drain region 82 disposed in neighboring fins 52. The top surfaces of each non-merged epitaxial source/drain region 82 comprise respective rounded top profiles. The rounded top profiles of the non-merged epitaxial source/drain region 82 may be formed by using hydrogen as the carrier gas. The non-merged epitaxial source/drain regions 82 may have a second width W2 measured between opposite sidewalls of the epitaxial source/drain regions 82 at their distance of greatest separation in a range of about 25 nm to about 40 nm. It is advantageous for the second width W2 to be in the range of about 25 nm to about 40 nm for improving both process yields and device properties. The second width W2 being less than about 25 nm may lead to lower yield and device loss. The second width W2 being greater than about 40 nm may lead to lower yield and device loss.

Figure 10E:
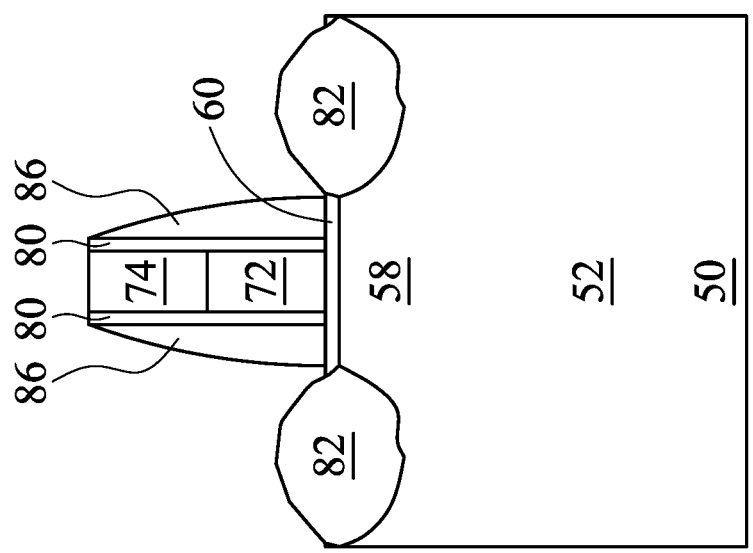
Figure 11D:
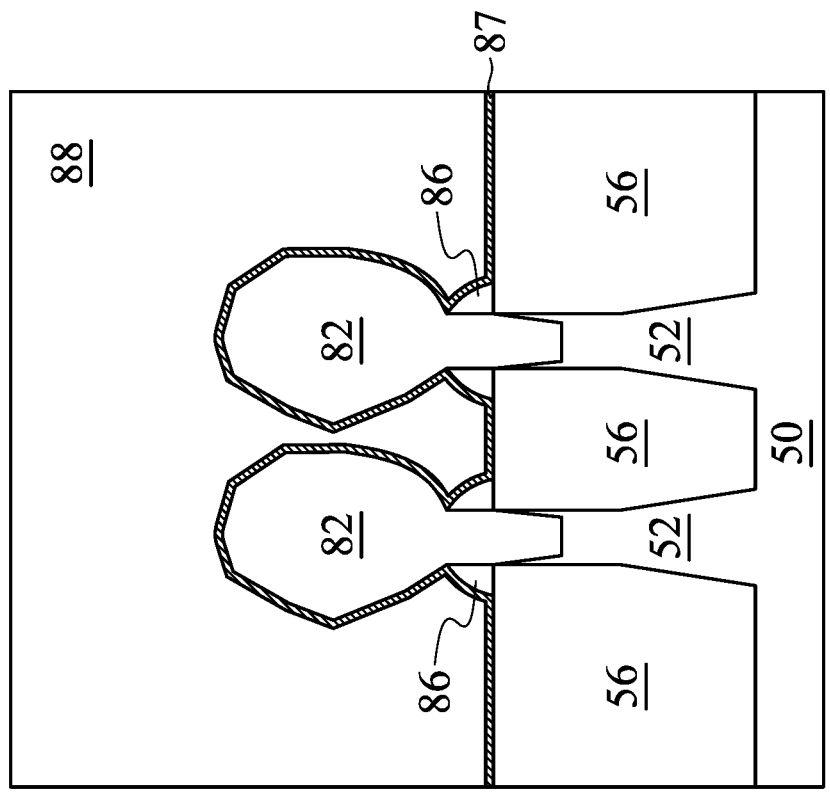
Figure 11C:
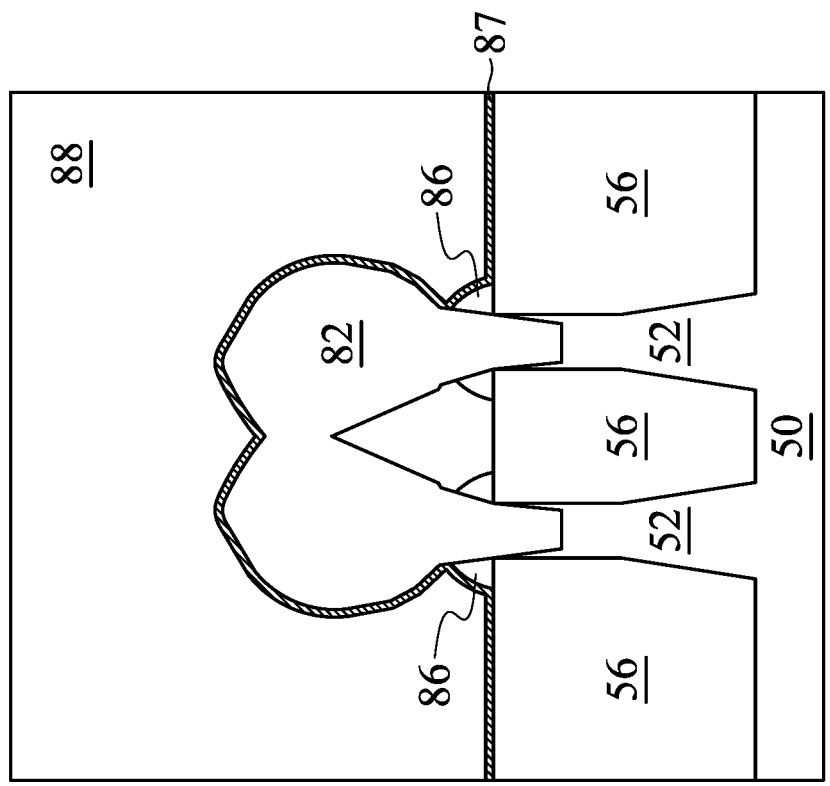
Figure 12B:
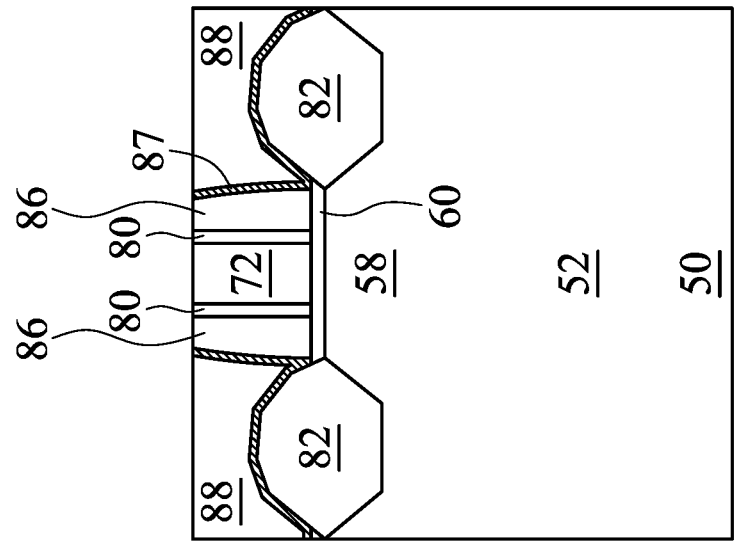
Figure 12A:
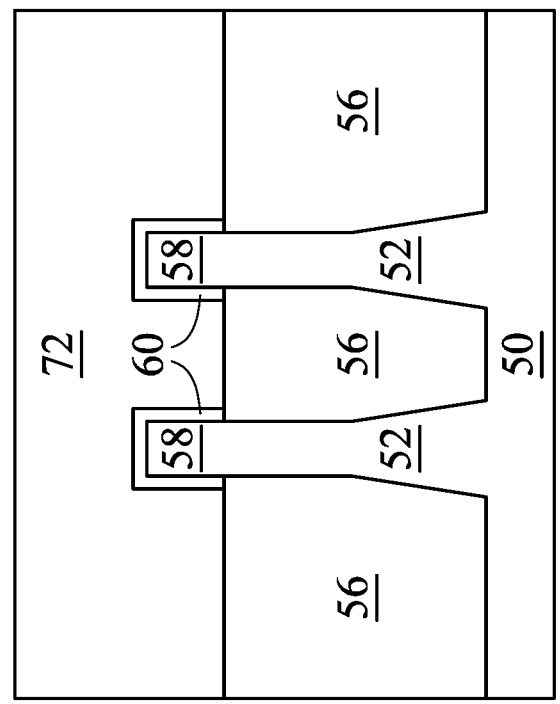
Figure 12D:
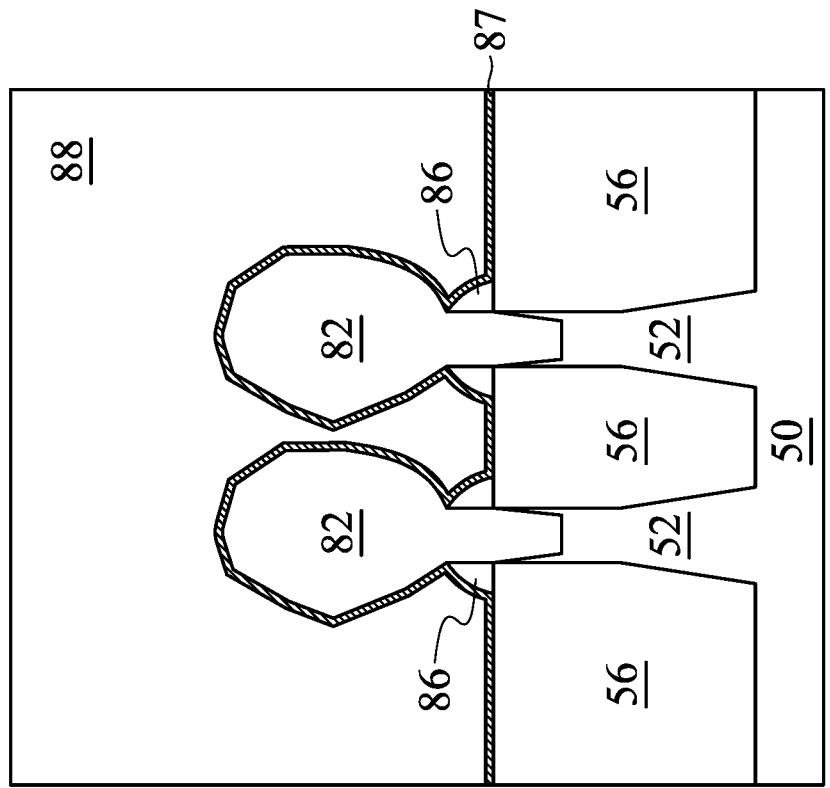
Figure 12C:
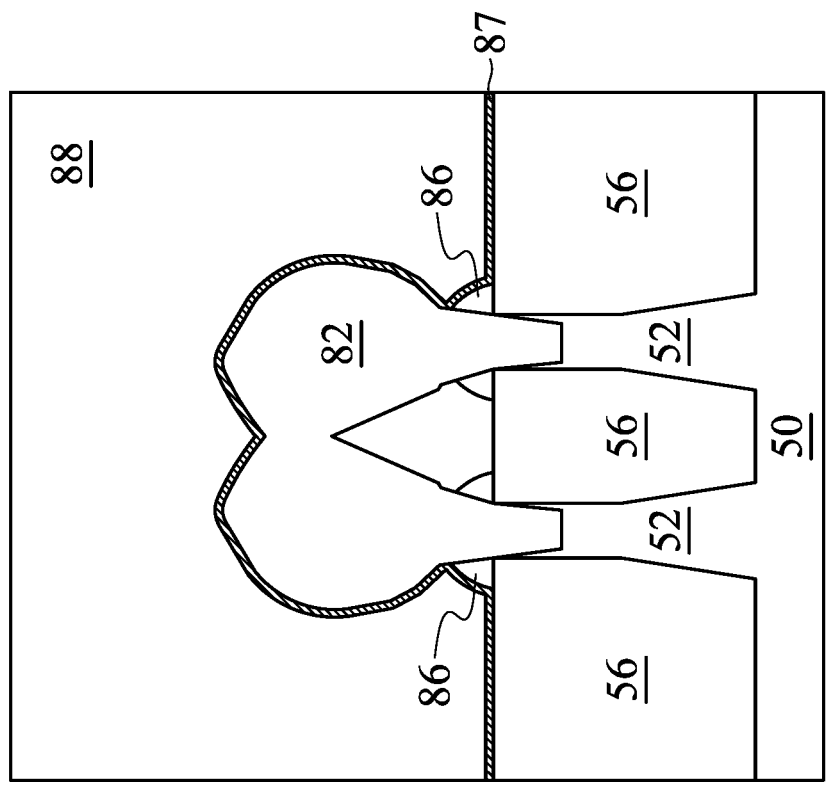
Figure 13D:
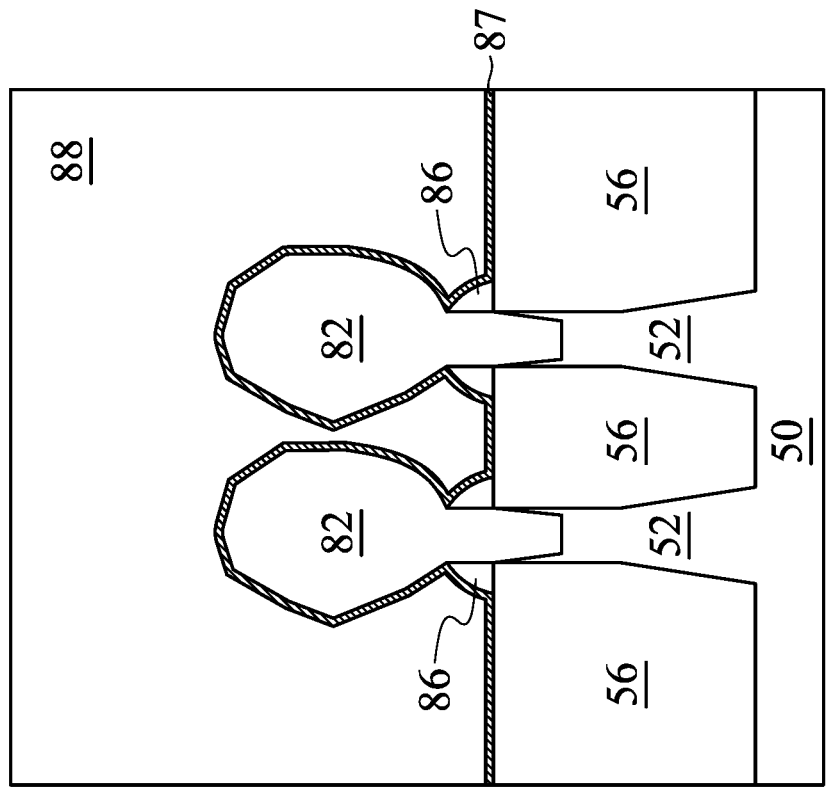
Figure 13C:
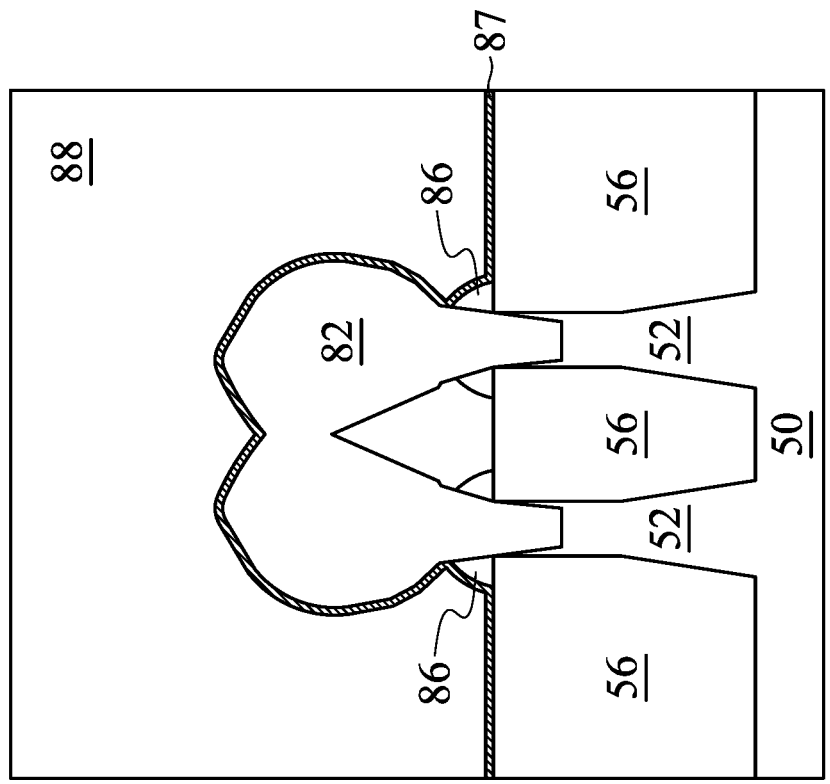

In accordance with some embodiments as illustrated by FIG. 10E, the epitaxial source/drain regions 82 may be formed with rounded bottom profiles rather than the faceted bottom profiles as illustrated by FIG. 10B. The shapes of the bottom profiles of the epitaxial source/drain regions 82 may be adjusted by, e.g., controlling the shapes of the recesses etched into the top surfaces of the fins 52.

The non-merged epitaxial source/drain regions 82 may have a third width W3 measured 10 nm below a highest point of the non-merged epitaxial source/drain regions 82. The third width W3 may be in a range of about 15 nm to about 35 nm. It is advantageous for the third width W3 to be in the range of about 15 nm to about 35 nm for improving both process yields and device properties. The third width W3 being less than about 15 nm may lead to lower yield and device loss. The third width W3 being greater than about 35 nm may lead to lower yield and device loss.

A ratio of the second width W2 to the third width W3 may be in a range of about 25:15 to about 40:35. It is advantageous for the ratio W2:W3 to be in the range of about 25:15 to about 40:35 for improving both process yields and device properties. The ratio W2:W3 being less than about 5:3 may lead to lower yield and device loss.

The non-merged epitaxial source/drain regions 82 may have a fourth height H4 measured from a bottom point of the non-merged epitaxial source/drain regions 82 to a top point of the non-merged epitaxial source/drain regions 82 in a range of about 40 nm to about 60 nm. It is advantageous for the fourth height H4 to be in the range of about 40 nm to about 60 nm for improving both process yields and device properties. The fourth height H4 being less than about 40 nm may lead to lower yield and device loss. The fourth height H4 being greater than about 60 nm may lead to lower yield and device loss.

Embodiments of the non-merged epitaxial source/drain regions 82 may provide advantages. The non-merged epitaxial source/drain regions 82 may be useful for high density (HD) SRAM transistors. HD SRAM transistors comprising single fin FinFETs with non-merged epitaxial source/drain regions between adjacent FinFETs may be useful for reducing power usage and area. This may achieve minimal cell standby leakage current as well a reduction in cell size, which is advantageous for miniaturization. HD SRAM cells may have a smaller pitch than the pitch of HC SRAM cells. In embodiments in which the non-merged epitaxial source/drain regions 82 are used in high density (HD) SRAM devices, the rounded top shapes of the epitaxial source/drain regions 82 may improve fin coverage of HD SRAM structures and prevent merging, or shorts, between neighboring HD SRAM source/drain regions by creating slimmer epitaxial source/drain shapes. The slim epitaxial source/drain region shapes of the HD SRAM structures may improve device performance by reducing the capacitance effect of the source/drain regions.

As illustrated in FIGS. 10C and 10D, in some embodiments the epitaxial source/drain regions 82 may extend below a surface level with the top surface of the STI regions 56. In other embodiments, the epitaxial source/drain regions 82 may be level with the top surface of the STI regions 56. In still other embodiments, bottom surfaces of the epitaxial source/drain regions 82 may be located above the surface level with the top surface of the STI regions 56.

In some embodiments, the rounded top profiles of the epitaxial source/drain regions 82 may reduce highly doped SiP source/drain region loss for downstream MEOL and BEOL processes. Production throughput may improve by about 20% due to a higher epitaxial growth rate and a reduced transition time. Enlarged highly doped source/drain volume may lead to reduced source/drain contact plug resistance.

In FIGS. 11A, 11B, 11C, and 11D, a first interlayer dielectric (ILD) 88 is deposited over the structures illustrated in FIGS. 10A, 10B, 10C, and 10D. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

In FIGS. 12A, 12B, 12C, and 12D, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 8o and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

In FIGS. 13A, 13B, 13C, and 13D, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
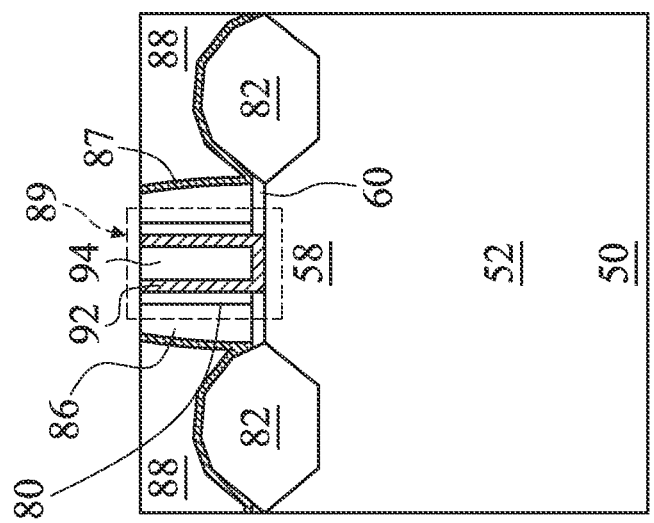
Figure 14A:
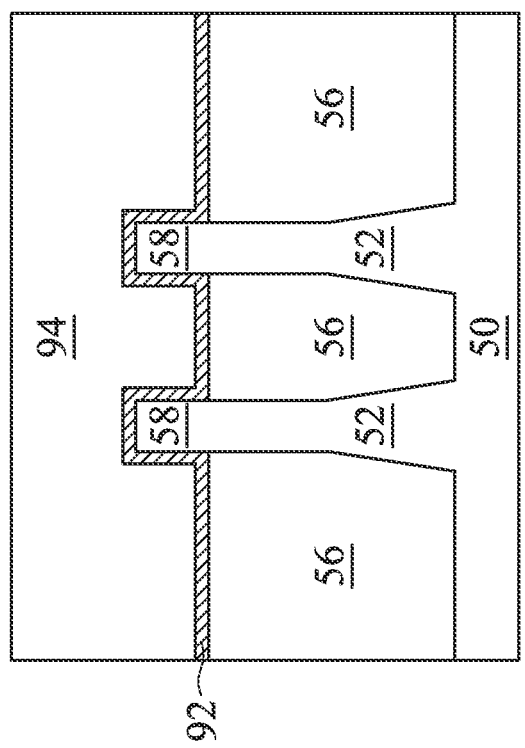
Figure 14C:
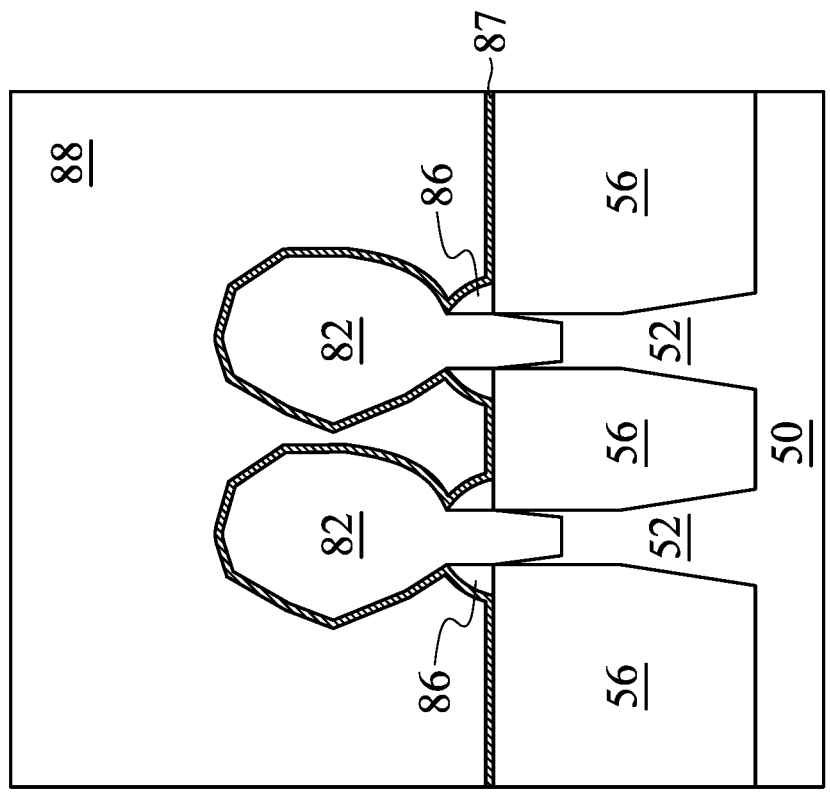
Figure 14D:
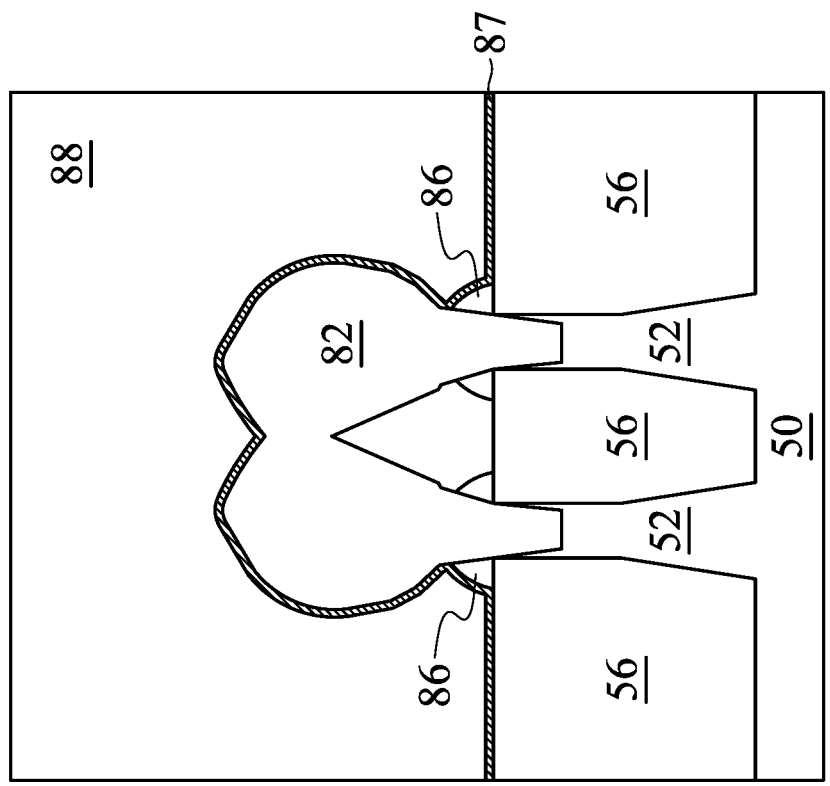
Figure 14E:
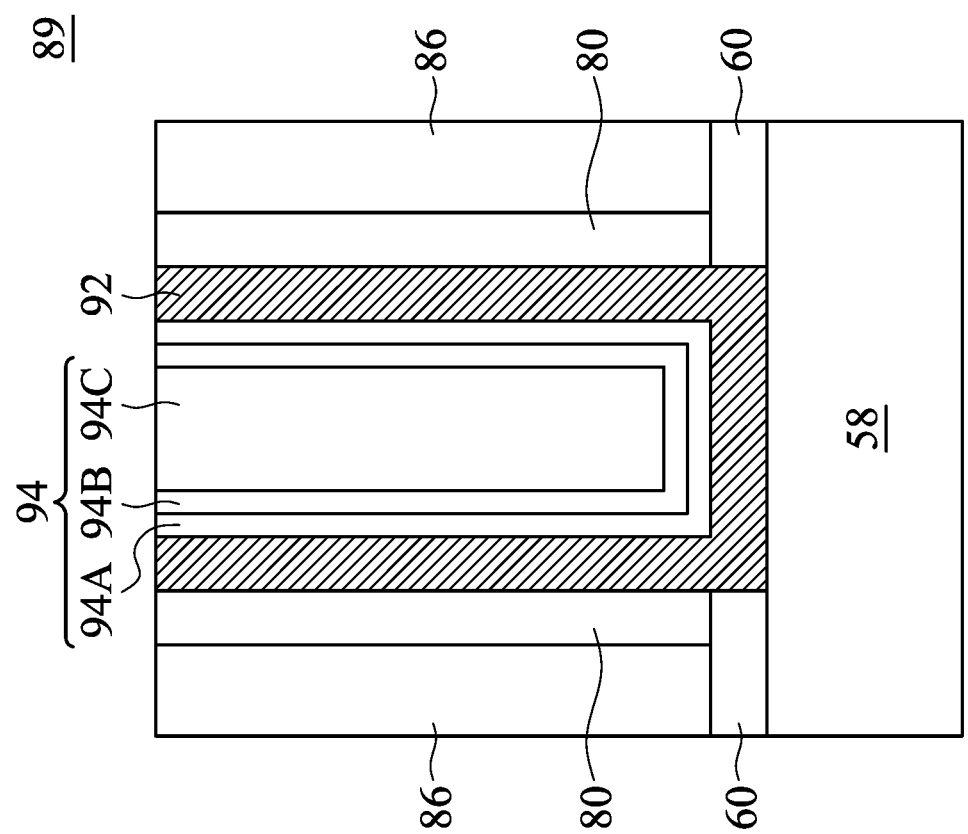

In FIGS. 14A, 14B, 14C, and 14D, gate dielectric layers 92 and gate electrodes 94 are formed for replacement gates. FIG. 14E illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14E. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15A:
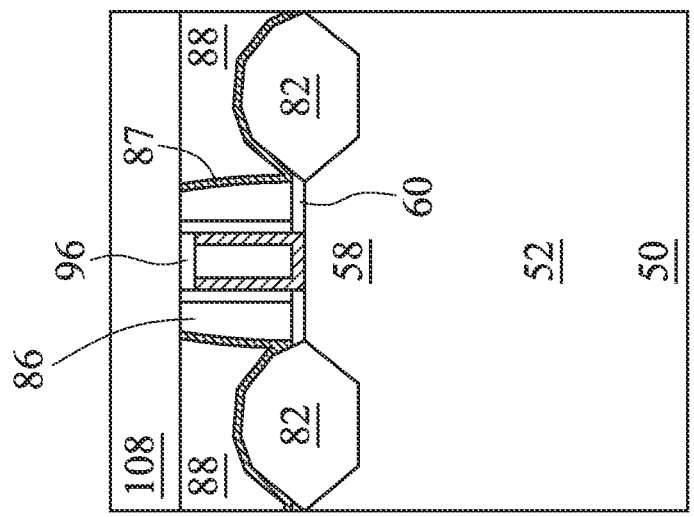
Figure 15B:
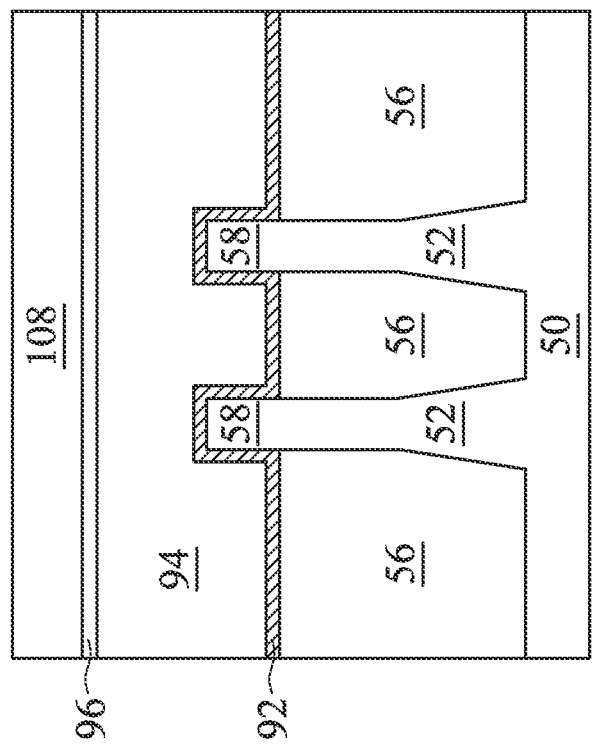
Figure 15C:
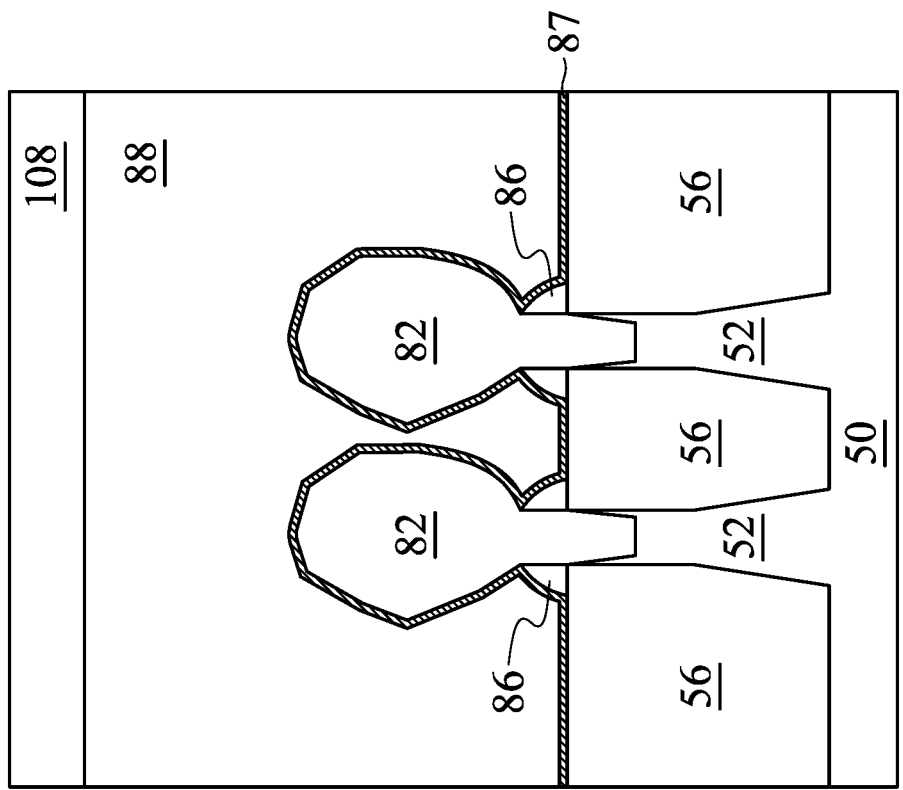
Figure 15D:
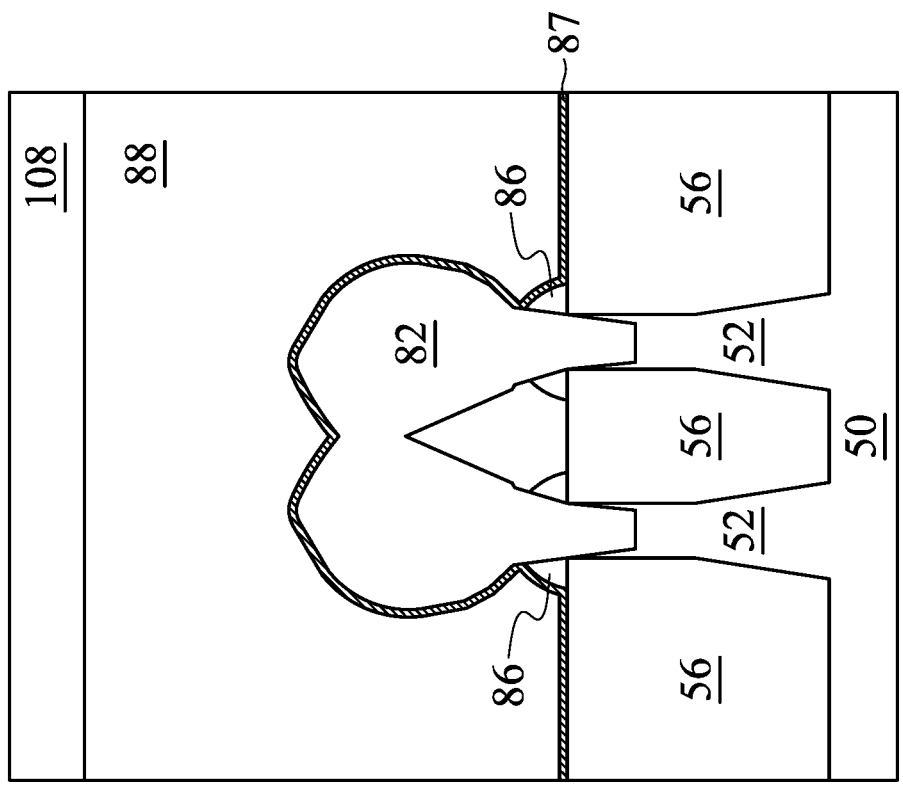

In FIGS. 15A, 15B, 15C, and 15D, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 15A and 15B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 16A and 16B) penetrate through the gate mask 96 to contact the top surface of the recessed gate electrode 94.

Figure 16B:
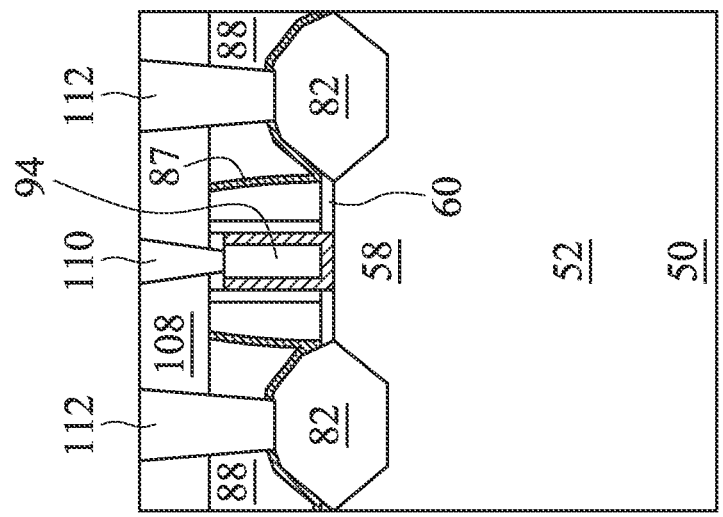
Figure 16A:
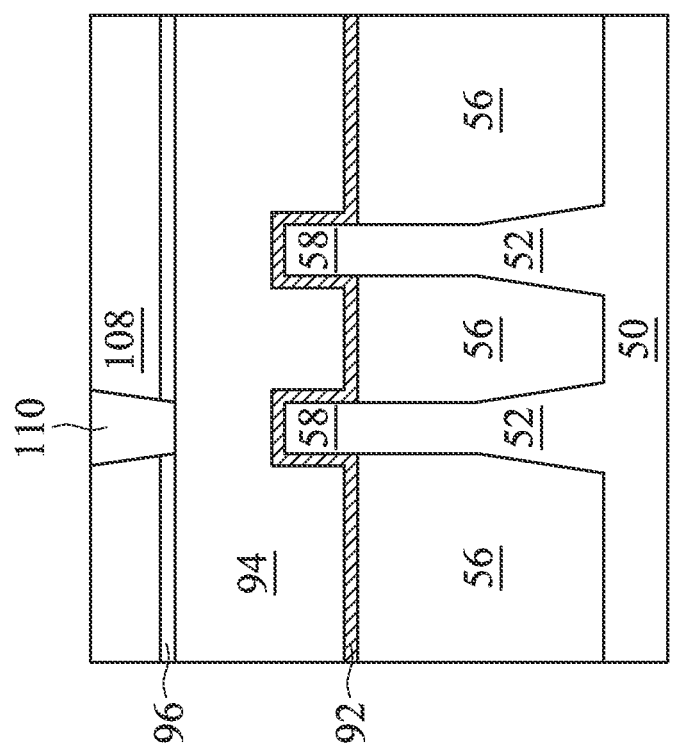
Figure 16D:
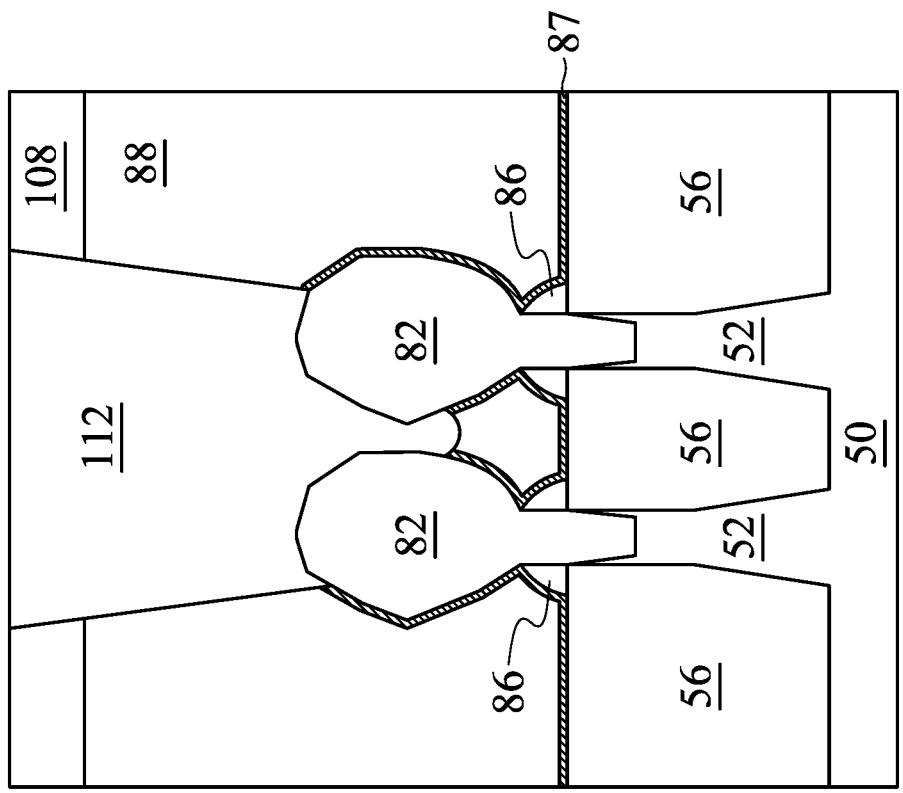
Figure 16C:
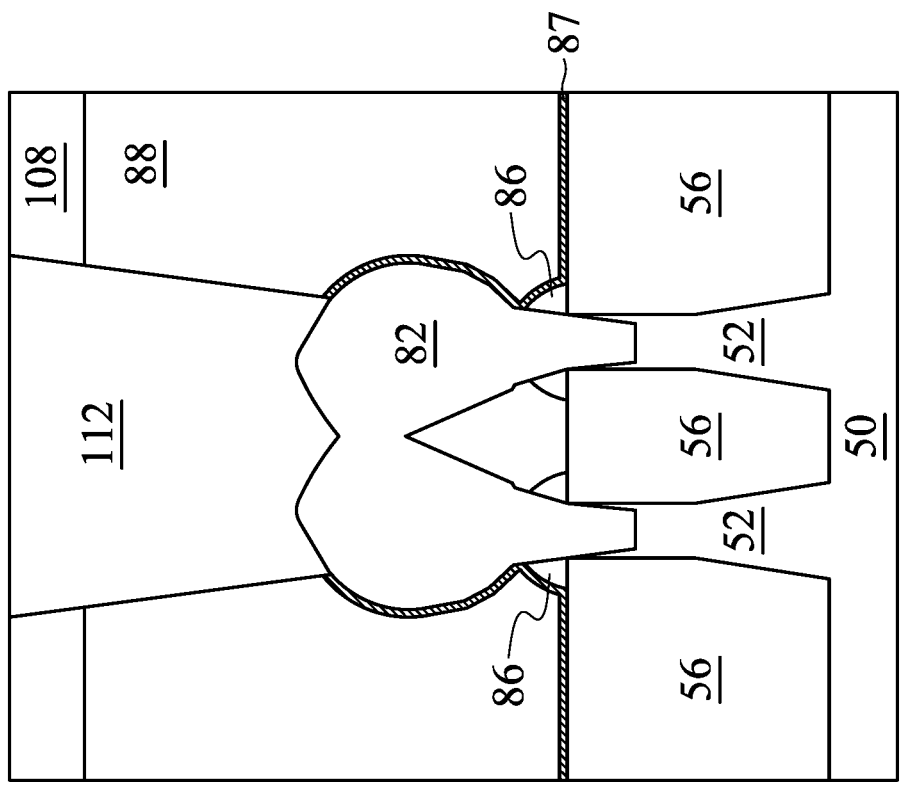
Figure 16E:
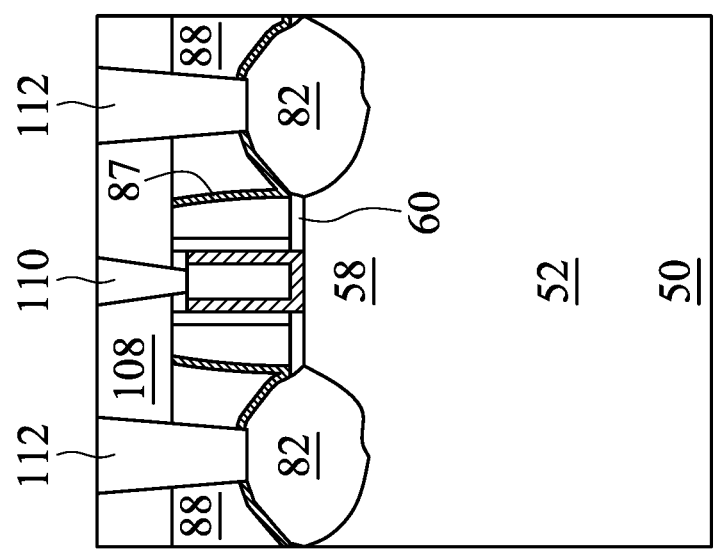

In FIGS. 16A, 16B, 16C, and 16D, gate contacts no and source/drain contacts 112 are formed through the second ILD 108 and the first ILD 88 in accordance with some embodiments. Openings for the source/drain contacts 112 are formed through the first and second ILDs 88 and 108, and openings for the gate contact no are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts no in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts no are physically and electrically coupled to the gate electrodes 94. The source/drain contacts 112 and gate contacts no may be formed in different processes, or may be formed in the same process. Although shown as being formed in the same cross-sections, it should be appreciated that each of the source/drain contacts 112 and gate contacts no may be formed in different cross-sections, which may avoid shorting of the contacts. The rounded top profiles of the epitaxial source/drain region 82 may provide a better, relatively flat landing area for source/drain contacts 112 for both high current (HC) and high density (HD) SRAM structures, as shown in FIGS. 16C and 16D. This may further reduce resistance of the source/drain contacts 112. FIG. 16E illustrates embodiments following from FIG. 10E with epitaxial source/drain regions 82 having rounded bottom profiles.

In some embodiments, the shapes of the epitaxial source/drain region 82 may result in improved characteristics. Nodule defects may be reduced by choice of an optimized gas ratio and carrier gas. The rounded top shapes of the epitaxial source/drain regions may prevent non-merging of intra-fin epitaxial regions, e.g. silicon phosphide (SiP), of neighboring source/drain regions used in HC SRAM devices. The rounded top shapes of the epitaxial source/drain regions may improve fin coverage of HD SRAM and prevent merging, or shorts, between neighboring HD SRAM source/drain regions by creating slimmer epitaxial source/drain shapes. Larger landing areas for contacts for both HC and HD SRAM structures may be provided by the rounded top profiles of the epitaxial regions, which may further reduce contact resistance. Enlarged highly doped source/drain volume may lead to reduced source/drain contact plug resistance. The rounded top profiles may reduce highly doped SiP source/drain region loss for downstream MEOL and BEOL processes. The higher intra-fin merge height of the HC SRAM structures and the slim epitaxial source/drain region shapes may improve device performance by reducing the capacitance effect.

In accordance with an embodiment, a semiconductor device includes: a first fin and a second fin, the first fin and the second fin extending from a substrate; a shallow trench isolation (STI) region disposed on the substrate between the first and second fins; and an epitaxial source/drain region, wherein the epitaxial source/drain region includes a first portion grown on the first fin and a second portion grown on the second fin, and wherein the first portion and the second portion are joined at a merging boundary. The epitaxial source/drain region further includes: a first subregion extending from a location level with a highest point of the epitaxial source/drain region to a location level with a highest point of the merging boundary, wherein the first subregion has a first height, and wherein a top surface of the first subregion includes a valley between the first fin and the second fin; a second subregion extending from the location level with the highest point of the merging boundary to a location level with a lowest point of the merging boundary, wherein the second subregion has a second height, and wherein the first height is less than the second height; and a third subregion extending from the location level with the lowest point of the merging boundary to a location level with a top surface of the STI region, wherein the third subregion has a third height, and wherein the first height is less than the third height and the second height is less than the third height. In an embodiment, the epitaxial source/drain region includes SiP. In an embodiment, a concentration of phosphorus in the epitaxial source/drain region is in a range from $1\times10^{21}$ atoms/cm$^{-3}$ to $4\times10^{21}$ atoms/cm$^{-3}$. In an embodiment, the epitaxial source/drain region extends below the location level with the top surface of the STI region. In an embodiment, the epitaxial source/drain region has a width in a range of 40 nm to 70 nm. In an embodiment, the first height is less than 10 nm. In an embodiment, the device is part of a memory array. In an embodiment, a ratio of the first height to the second height is less than 5:9. In an embodiment, a ratio of the first height to the third height is less than 1:4.

In accordance with another embodiment, a semiconductor device includes: a high density (HD) circuit area on a substrate including an HD memory cell and a high current (HC) circuit area on a substrate including an HC memory cell with an operating speed greater than the HD memory cell, a pitch of fins in the HD memory cell being smaller than the HC memory cell, the HD memory cell including: a first fin extending from the substrate; a first epitaxial source/drain region on the first fin; a second fin extending from the substrate and adjacent the first fin; a third fin extending from the substrate and adjacent the first fin; a second epitaxial source/drain region on the second fin; and a third epitaxial source/drain region on the third fin, wherein the third epitaxial source/drain region is physically separated from the second epitaxial source/drain region and the first epitaxial source/drain region; and a high current (HC) circuit area on a substrate including an HC memory cell with an operating speed greater than the HD memory cell, a pitch of fins in the HD memory cell is smaller than the HC memory cell, the HC memory cell including: a fourth fin and a fifth fin extending from the substrate; and a fourth epitaxial source/drain region, wherein the fourth epitaxial source/drain region includes a first portion grown on the fourth fin, wherein the fourth epitaxial source/drain region includes a second portion grown on the fifth fin, wherein the first portion and the second portion are joined at a merging boundary, and wherein the fourth epitaxial source/drain region further includes: a first subregion extending from a location level with a highest point of the fourth epitaxial source/drain region to a location level with a highest point of the merging boundary; a second subregion extending from the location level with the highest point of the merging boundary to a location level with a lowest point of the merging boundary; and a third subregion extending from the location level with the lowest point of the merging boundary to a location level with a lowest point of the fourth epitaxial source/drain region. In an embodiment, the first epitaxial source/drain region has a first height measured from a location level with a bottom point of the first epitaxial source/drain region to a location level with a highest point of the first epitaxial source/drain region, wherein the first epitaxial source/drain region has a first width measured between points of opposite sidewalls of the first epitaxial source/drain region at their greatest separation, and wherein a ratio of the first width to the first height is in a range of 5:12 to 1:1. In an embodiment, a first width of the first epitaxial source/drain region is in a range of 25 nm to 40 nm. In an embodiment, a first height of the first epitaxial source/drain region is in a range of 40 nm to 60 nm. In an embodiment, the first epitaxial source/drain region has a second width measured 10 nm below a highest point of the first epitaxial source/drain region, wherein the second width is in a range of 15 nm to 35 nm.

In accordance with yet another embodiment, a method for forming a semiconductor device includes: forming shallow trench isolation (STI) regions adjacent a first fin and a second fin disposed on a substrate; forming a first recess in the first fin; forming a second recess in a second fin; and epitaxially growing a first source/drain region in the first recess and a second source/drain region in the second recess, wherein the first and second source/drain regions include respective rounded top profiles, wherein the first source/drain region and the second source/drain region merge at a merging boundary to form a merged source/drain region, wherein the merged source/drain region has a first height measured from a location level with a highest point of the merged source/drain region to a location level with a highest point of the merging boundary, wherein the merged source/drain region has a second height measured from the location level with the highest point of the merging boundary to a location level with a lowest point of the merging boundary, wherein the merged source/drain region has a third height measured from the location level with the lowest point of the merging boundary to a location level with the top surface of the STI regions, wherein the first height is less than the second height, wherein the first height is less than the third height, and wherein the second height is less than the third height. In an embodiment, epitaxially growing the source/drain region includes a reduced pressure chemical vapor deposition (RPCVD) process. In an embodiment, the RPCVD process is performed at a temperature in a range from 650° C. to 750° C. In an embodiment, epitaxially growing the source/drain regions includes a cyclic-deposition etch (CDE) process. In an embodiment, epitaxially growing the source/drain regions includes using a silicon-rich precursor gas, a phosphorus source precursor gas, and a carrier gas, the carrier gas including hydrogen. In an embodiment, a ratio of the silicon source precursor to the carrier gas is in a range from 2:1 to 10:1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first fin and a second fin, the first fin and the second fin extending from a substrate;
a shallow trench isolation (STI) region disposed on the substrate between the first and second fins; and
a first epitaxial source/drain region, wherein the first epitaxial source/drain region comprises a first portion grown on the first fin and a second portion grown on the second fin, wherein the first portion and the second portion are joined at a merging boundary, wherein the first epitaxial source/drain region further comprises:
a first subregion extending from a location level with a highest point of the first epitaxial source/drain region to a location level with a highest point of the merging boundary, wherein the first subregion has a first height, and wherein a top surface of the first subregion comprises a valley between the first fin and the second fin;
a second subregion extending from the location level with the highest point of the merging boundary to a location level with a lowest point of the merging boundary, wherein the second subregion has a second height, and wherein the first height is less than the second height, a ratio of the first height to the second height being less than 5:9; and a third subregion extending from the location level with the lowest point of the merging boundary to a location level with a top surface of the STI region, wherein the third subregion has a third height, and wherein the first height is less than the third height and the second height is less than the third height.

2. The device of claim 1, wherein the first epitaxial source/drain region comprises SiP.

3. The device of claim 2, wherein a concentration of phosphorus in the first epitaxial source/drain region is in a range from $1 \times 10^{21}$ atoms/cm$^{-3}$ to $4 \times 10^{21}$ atoms/cm$^{-3}$.

4. The device of claim 1, wherein the first epitaxial source/drain region extends below the location level with the top surface of the STI region.

5. The device of claim 1, wherein the first epitaxial source/drain region has a width in a range of 40 nm to 70 nm.

6. The device of claim 1, wherein the first height is less than 10 nm.

7. The device of claim 1, wherein the device is part of a memory array.

8. The device of claim 1, wherein a ratio of the first height to the third height is less than 1:4.

9. A semiconductor device comprising:
a high density (HD) circuit area on a substrate comprising an HD memory cell, the HD memory cell comprising:
a first fin extending from the substrate;
a first epitaxial source/drain region on the first fin;
a second fin extending from the substrate and adjacent the first fin;
a third fin extending from the substrate and adjacent the first fin;
a second epitaxial source/drain region on the second fin; and
a third epitaxial source/drain region on the third fin, wherein the third epitaxial source/drain region is physically separated from the second epitaxial source/drain region and the first epitaxial source/drain region; and
a high current (HC) circuit area on a substrate comprising an HC memory cell with an operating speed greater than the HD memory cell, a pitch of fins in the HD memory cell being smaller than the HC memory cell, the HC memory cell comprising:
a fourth fin and a fifth fin extending from the substrate; and
a fourth epitaxial source/drain region, wherein the fourth epitaxial source/drain region comprises a first portion grown on the fourth fin, wherein the fourth epitaxial source/drain region comprises a second portion grown on the fifth fin, wherein the first portion and the second portion are joined at a merging boundary, and wherein the fourth epitaxial source/drain region further comprises:
a first subregion extending from a location level with a highest point of the fourth epitaxial source/drain region to a location level with a highest point of the merging boundary;
a second subregion extending from the location level with the highest point of the merging boundary to a location level with a lowest point of the merging boundary; and
a third subregion extending from the location level with the lowest point of the merging boundary to a location level with a lowest point of the fourth epitaxial source/drain region.

10. The device of claim 9, wherein the first epitaxial source/drain region has a first height measured from a location level with a bottom point of the first epitaxial source/drain region to a location level with a highest point of the first epitaxial source/drain region, wherein the first epitaxial source/drain region has a first width measured between points of opposite sidewalls of the first epitaxial source/drain region at their greatest separation, and wherein a ratio of the first width to the first height is in a range of 5:12 to 1:1.

11. The device of claim 9, wherein a first width of the first epitaxial source/drain region is in a range of 25 nm to 40 nm.

12. The device of claim 9, wherein a first height of the first epitaxial source/drain region is in a range of 40 nm to 60 nm.

13. The device of claim 9, wherein the first epitaxial source/drain region has a second width measured 10 nm below a highest point of the first epitaxial source/drain region, wherein the second width is in a range of 15 nm to 35 nm.

14. A semiconductor device comprising:
a first fin and a second fin, the first fin and the second fin disposed on a substrate;
an isolation region between the first and second fins, the isolation region being on the substrate;
a first source/drain region extending from the first fin, the first source/drain region having a first rounded top profile; and
a second source/drain region extending from the second fin, the second source/drain region having a second rounded top profile, a valley being between the first rounded top profile of the first source/drain region and the second rounded top profile of the second source/drain region, a depth of the valley being less than 10 nm, wherein the second source/drain region contacts the first source/drain region at a merging boundary, wherein the second source/drain region has a first height measured from a location level with a highest point of the second source/drain region to a location level with a highest point of the merging boundary, wherein the second source/drain region has a second height measured from the location level with the highest point of the merging boundary to a location level with a lowest point of the merging boundary, wherein the second source/drain region has a third height measured from the location level with the lowest point of the merging boundary to a location level with a top surface of the isolation region, wherein the first height is smaller than the second height, wherein the second height is smaller than the third height, and wherein the first height is smaller than the third height.

15. The semiconductor device of claim 14, wherein the second height is in a range of 18 nm to 28 nm.

16. The semiconductor device of claim 14, wherein the third height is in a range of 25 nm to 40 nm.

17. The semiconductor device of claim 14, wherein a combined width of the first source/drain region and the second source/drain region is in a range of 40 nm to 70 nm.

18. The semiconductor device of claim 14, wherein the first source/drain region and the second source/drain region are silicon phosphide.

19. The device of claim 1, further comprising:
a third fin extending from the substrate;
a second epitaxial source/drain region on the third fin;
a fourth fin extending from the substrate and adjacent the third fin;

a fifth fin extending from the substrate and adjacent the first fin;
a third epitaxial source/drain region on the fourth fin; and
a fourth epitaxial source/drain region on the fifth fin, wherein the fourth epitaxial source/drain region is physically separated from the third epitaxial source/drain region and the second epitaxial source/drain region.

20. The semiconductor device of claim 14, further comprising a high density (HD) memory cell on the substrate, wherein the first fin and the second fin are part of a high current (HC) memory cell on the substrate, the HC memory cell having an operating speed greater than the HD memory cell.

* * * * *